US012696513B2

(12) United States Patent
Lee et al.

(10) Patent No.: US 12,696,513 B2
(45) Date of Patent: Jul. 28, 2026

(54) WORK-FUNCTION METAL IN TRANSISTORS AND METHOD FORMING SAME

(71) Applicant: Taiwan Semiconductor Manufacturing Co., Ltd., Hsinchu (TW)

(72) Inventors: Hsin-Yi Lee, Hsinchu (TW); Chun-Da Liao, Taipei City (TW); Cheng-Lung Hung, Hsinchu (TW); Yan-Ming Tsai, Toufen Township (TW); Harry Chien, Chandler, AZ (US); Huang-Lin Chao, Hillsboro, OR (US); Weng Chang, Hsinchu (TW); Chih-Wei Chang, Hsinchu (TW); Ming-Hsing Tsai, Chu-Pei City (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 671 days.

(21) Appl. No.: 17/662,545

(22) Filed: May 9, 2022

(65) Prior Publication Data

US 2023/0282729 A1    Sep. 7, 2023

Related U.S. Application Data

(60) Provisional application No. 63/268,874, filed on Mar. 4, 2022.

(51) Int. Cl.
H10D 64/01 (2025.01)
H10D 30/01 (2025.01)
(Continued)

(52) U.S. Cl.
CPC ......... H10D 64/017 (2025.01); H10D 30/014 (2025.01); H10D 30/43 (2025.01);
(Continued)

(58) Field of Classification Search
CPC .......... H01L 29/66545; H01L 29/0673; H01L 29/42392; H01L 29/66439; H01L 29/775;
(Continued)

(56) References Cited

U.S. PATENT DOCUMENTS 11,152,488 B2    10/2021    Lin et al.
11,437,474 B2    9/2022    Lee et al.
(Continued)

FOREIGN PATENT DOCUMENTS

KR        20200037088 A        4/2020
KR        20210084206 A        7/2021
(Continued)

*Primary Examiner* — Igwe U Anya
(74) *Attorney, Agent, or Firm* — Slater Matsil, LLP

(57) ABSTRACT

A method includes forming a dummy gate stack over a semiconductor region, forming a source/drain region on a side of the dummy gate stack, removing the dummy gate stack to form a trench, forming a gate dielectric layer extending into the trench and on the semiconductor region, and depositing a first work-function layer over the gate dielectric layer. The first work-function layer comprises a metal selected from the group consisting of ruthenium, molybdenum, and combinations thereof. The method further includes depositing a conductive filling layer over the first work-function layer, and performing a planarization process to remove excess portions of the conductive filling layer, the first work-function layer, and the gate dielectric layer to form a gate stack.

20 Claims, 29 Drawing Sheets

(51) Int. Cl.

| | |
|---|---|
| *H10D 30/43* | (2025.01) |
| *H10D 30/67* | (2025.01) |
| *H10D 62/10* | (2025.01) |

(52) U.S. Cl.
CPC ..... *H10D 30/6735* (2025.01); *H10D 30/6757* (2025.01); *H10D 62/121* (2025.01)

(58) Field of Classification Search
CPC ............ H01L 29/78696; H10D 30/014; H10D 30/6757; H10D 30/6735; H10D 30/43; H10D 62/121; H10D 64/017
USPC ........................................................ 257/211
See application file for complete search history.

(56) References Cited

U.S. PATENT DOCUMENTS

| | | | |
|---|---|---|---|
| 11,594,614 | B2 | 2/2023 | Yu et al. |
| 11,699,729 | B2 | 7/2023 | Ju et al. |
| 11,894,464 | B2 | 2/2024 | Kao et al. |

| | | | | |
|---|---|---|---|---|
| 2011/0198699 | A1* | 8/2011 | Hung | H01L 29/7848 |
| | | | | 257/369 |
| 2012/0181630 | A1* | 7/2012 | Ando | H10D 64/013 |
| | | | | 257/E21.409 |
| 2015/0287645 | A1* | 10/2015 | Zhao | H01L 21/823878 |
| | | | | 438/200 |
| 2019/0131185 | A1 | 5/2019 | Huang et al. | |
| 2021/0249313 | A1* | 8/2021 | Chen | H01L 27/0924 |
| 2021/0408289 | A1 | 12/2021 | Guha et al. | |
| 2022/0059691 | A1* | 2/2022 | Shen | H10D 30/65 |
| 2024/0363627 | A1 | 10/2024 | Chiu et al. | |
| 2025/0311334 | A1 | 10/2025 | Young et al. | |
| 2025/0311412 | A1 | 10/2025 | Chung et al. | |

FOREIGN PATENT DOCUMENTS

| | | |
|---|---|---|
| KR | 20210109412 A | 9/2021 |
| KR | 20220000797 A | 1/2022 |
| KR | 20220001423 A | 1/2022 |
| KR | 20220022085 A | 2/2022 |
| TW | 202109880 A | 3/2021 |
| TW | 202129765 A | 8/2021 |
| TW | 202205534 A | 2/2022 |

* cited by examiner

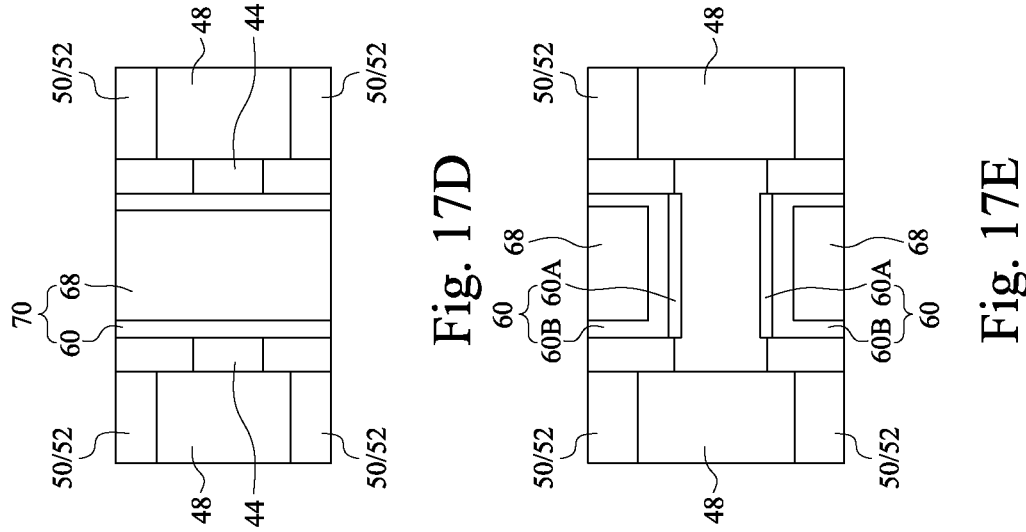
Fig. 17D
Fig. 17E
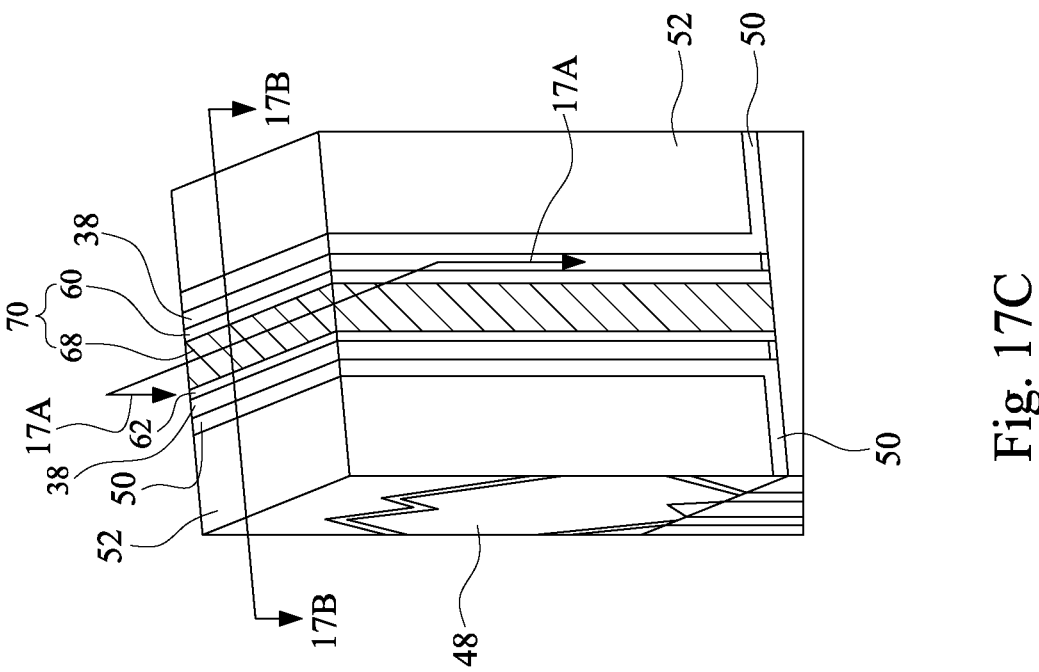
Fig. 17C

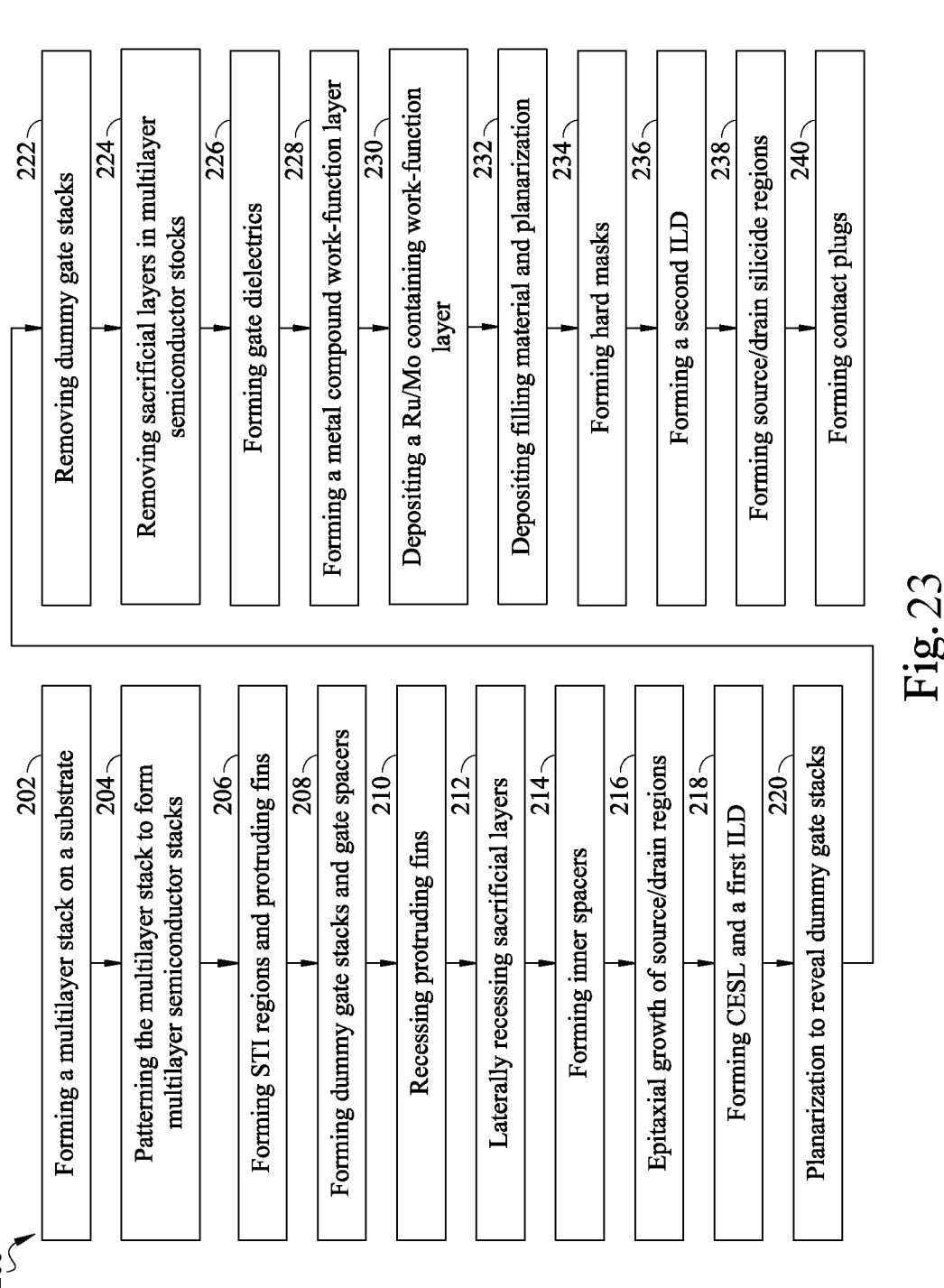

200

202 Forming a multilayer stack on a substrate

204 Patterning the multilayer stack to form multilayer semiconductor stacks

206 Forming STI regions and protruding fins

208 Forming dummy gate stacks and gate spacers

210 Recessing protruding fins

212 Laterally recessing sacrificial layers

214 Forming inner spacers

216 Epitaxial growth of source/drain regions

218 Forming CESL and a first ILD

220 Planarization to reveal dummy gate stacks

222 Removing dummy gate stacks

224 Removing sacrificial layers in multilayer semiconductor stacks

226 Forming gate dielectrics

228 Forming a metal compound work-function layer

230 Depositing a Ru/Mo containing work-function layer

232 Depositing filling material and planarization

234 Forming hard masks

236 Forming a second ILD

238 Forming source/drain silicide regions

240 Forming contact plugs

Fig. 23

WORK-FUNCTION METAL IN TRANSISTORS AND METHOD FORMING SAME

PRIORITY CLAIM AND CROSS-REFERENCE

This application claims the benefit of the following provisionally filed U.S. Patent application: Application No. 63/268,874, filed on Mar. 4, 2022, and entitled "Mo/Ru as Work-function Metal in Nanosheet and Structure Formed Thereby," which application is hereby incorporated herein by reference.

BACKGROUND

Transistors are basic building elements in integrated circuits. In previous development of the integrated circuits, Fin Field-Effect Transistors (FinFETs) and Gate-All-Around (GAA) transistors have been formed to replace planar transistors. In the formation of FinFETs or GAA transistors, semiconductor fins or semiconductor sheets are formed, and dummy gates are formed on the semiconductor fins/sheets. The formation of the dummy gates may include depositing a dummy layer such as a polysilicon layer, and then patterning the dummy layer as dummy gates. Gate spacers are formed on the sidewalls of the dummy gate stacks. The dummy gate stacks are then removed to form trenches between the gate spacers. Replacement gates are then formed in the trenches.

When forming the replacement gates, different materials are selected for the formation of n-type transistors and p-type transistors. For example, n-type transistors may adopt TiAl in their replacement gates, while p-type transistors may adopt TiN in their replacement gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-4, 5A, 5B, 6A, 6B, 7A, 7B, 8A, 8B, 9A, 9B, 10A, 10B, 10C, 11A, 11B, 12A, 12B, 12C, 13A, 13B, 13C, 14A, 14B, 14C, 15A, 15B, 16A, 16B, 17A, 17B, 17C, 17D, 17E, 18A, 18B, 18C, 19A, 19B, and 19C illustrate various views of intermediate stages in the formation of a Gate All-Around (GAA) transistor in accordance with some embodiments.

FIG. 23 illustrates a process flow for forming a GAA transistor in accordance with some embodiments.

DETAILED DESCRIPTION

Figure 1:
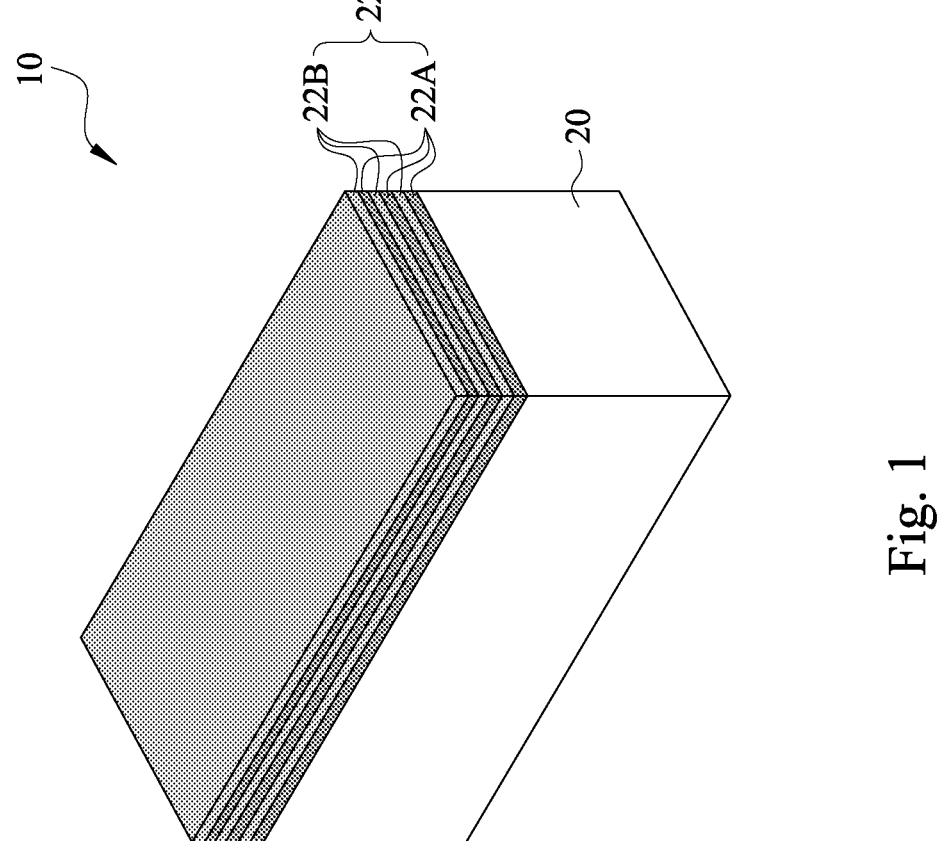

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of forming replacement gate stacks adopting ruthenium and/or molybdenum and the corresponding transistors are provided. In accordance with some embodiments, a dummy gate stack is formed on semiconductor nanostructures, and is then removed, hence revealing semiconductor nanostructures. A gate dielectric including an interfacial layer and a high-k dielectric layer is formed on the semiconductor nanostructures. A metal layer comprising ruthenium and/or molybdenum is deposited on the high-k dielectric layer as a work-function layer. Ruthenium and/or molybdenum may be used in the work-function layers of both of a p-type transistor and an n-type transistor. In the description of the present disclosure, a GAA transistor is presented to explain the concept of the present disclosure. The embodiments of the present disclosure may also be applied to other types of transistors such FinFETs, planar transistors, and the like. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-4, 5A, 5B, 6A, 6B, 7A, 7B, 8A, 8B, 9A, 9B, 10A, 10B, 10C, 11A, 11B, 12A, 12B, 12C, 13A, 13B, 13C, 14A, 14B, 14C, 15A, 15B, 16A, 16B, 17A, 17B, 17C. 17D. 17E, 18A, 18B, 18C, 19A, 19B, and 19C illustrate various views of intermediate stages in the formation of a GAA transistor in accordance with some embodiments of the present disclosure. The corresponding processes are also reflected schematically in the process flow shown in FIG. 23.

Referring to FIG. 1, a perspective view of wafer 10 is shown. Wafer 10 includes a multilayer structure comprising multilayer stack 22 on substrate 20. In accordance with some embodiments, substrate 20 is a semiconductor substrate, which may be a silicon substrate, a silicon germanium (SiGe) substrate, or the like, while other substrates and/or structures, such as semiconductor-on-insulator (SOI), strained SOI, silicon germanium on insulator, or the like, could be used. Substrate 20 may be doped as a p-type semiconductor, although in other embodiments, it may be doped as an n-type semiconductor.

In accordance with some embodiments, multilayer stack 22 is formed through a series of deposition processes for depositing alternating materials. The respective process is illustrated as process 202 in the process flow 200 shown in FIG. 23. In accordance with some embodiments, multilayer stack 22 comprises first layers 22A formed of a first semiconductor material and second layers 22B formed of a second semiconductor material different from the first semiconductor material.

In accordance with some embodiments, the first semiconductor material of a first layer 22A is formed of or comprises SiGe, Ge, Si, GaAs, InSb, GaSb, InAlAs, InGaAs, GaSbP, GaAsSb, or the like. In accordance with some embodiments, the deposition of first layers 22A (for example, SiGe) is through epitaxial growth, and the corresponding deposition method may be Vapor-Phase Epitaxy (VPE), Molecular Beam Epitaxy (MBE), Chemical Vapor deposition (CVD), Low Pressure CVD (LPCVD), Atomic Layer Deposition (ALD), Ultra High Vacuum CVD (UHVCVD), Reduced Pressure CVD (RPCVD), or the like. In accordance with some embodiments, the first layer 22A is formed to a first thickness in the range between about 30 Å and about 300 Å. However, any suitable thickness may be utilized while remaining within the scope of the embodiments.

Once the first layer 22A has been deposited over substrate 20, a second layer 22B is deposited over the first layer 22A. In accordance with some embodiments, the second layers 22B is formed of or comprises a second semiconductor material such as Si, SiGe, Ge, GaAs, InSb, GaSb, InAlAs, InGaAs, GaSbP, GaAsSb, combinations of these, or the like, with the second semiconductor material being different from the first semiconductor material of first layer 22A. For example, in accordance with some embodiments in which the first layer 22A is silicon germanium, the second layer 22B may be formed of silicon, or vice versa. It is appreciated that any suitable combination of materials may be utilized for first layers 22A and the second layers 22B.

In accordance with some embodiments, the second layer 22B is epitaxially grown on the first layer 22A using a deposition technique similar to that is used to form the first layer 22A. In accordance with some embodiments, the second layer 22B is formed to a similar thickness to that of the first layer 22A. The second layer 22B may also be formed to a thickness that is different from the first layer 22A. In accordance with some embodiments, the second layer 22B may be formed to a second thickness in the range between about 10 Å and about 500 Å, for example.

Once the second layer 22B has been formed over the first layer 22A, the deposition process is repeated to form the remaining layers in multilayer stack 22, until a desired topmost layer of multilayer stack 22 has been formed. In accordance with some embodiments, first layers 22A have thicknesses the same as or similar to each other, and second layers 22B have thicknesses the same as or similar to each other. First layers 22A may also have the same thicknesses as, or different thicknesses from, that of second layers 22B. In accordance with some embodiments, first layers 22A are removed in the subsequent processes, and are alternatively referred to as sacrificial layers 22A throughout the description. In accordance with alternative embodiments, second layers 22B are sacrificial, and are removed in the subsequent processes.

In accordance with some embodiments, there are some pad oxide layer(s) and hard mask layer(s) (not shown)

formed over multilayer stack 22. These layers are patterned, and are used for the subsequent patterning of multilayer stack 22.

Figure 2:
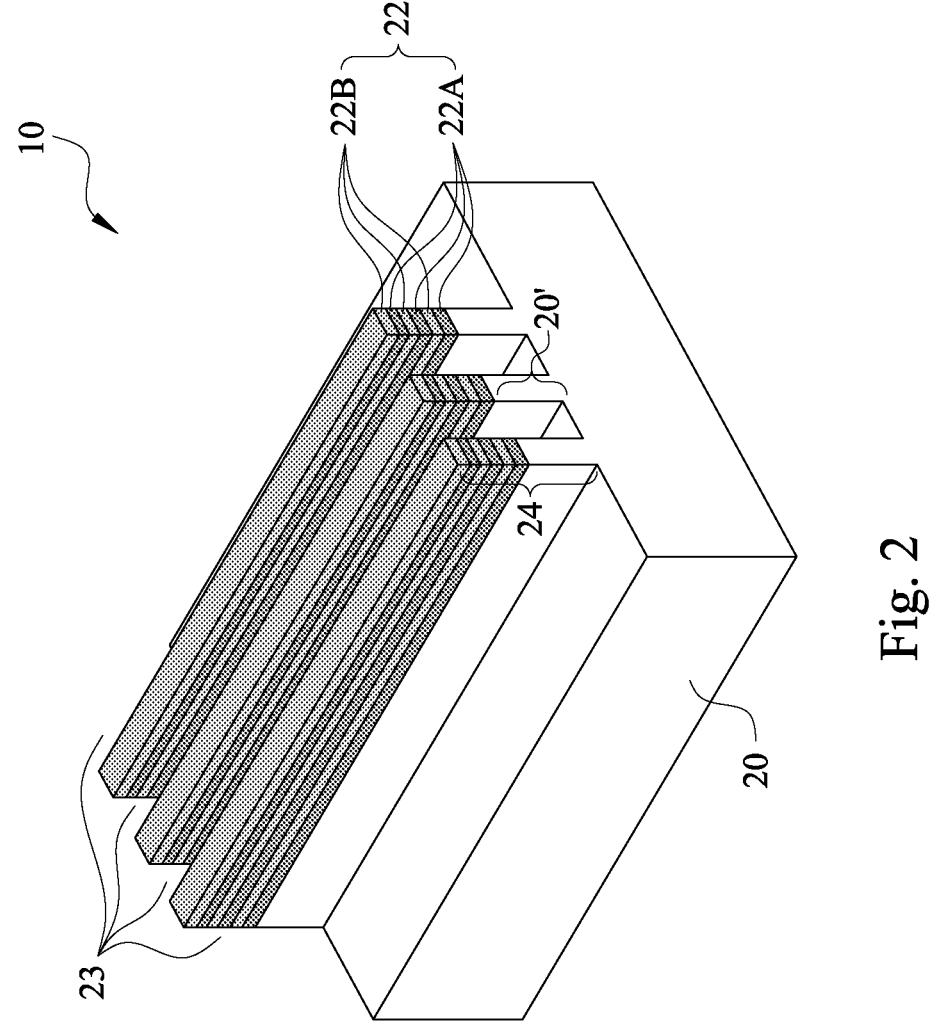

Referring to FIG. 2, multilayer stack 22 and a portion of the underlying substrate 20 are patterned in an etching process(es), so that trenches 23 are formed. The respective process is illustrated as process 204 in the process flow 200 shown in FIG. 23. Trenches 23 extend into substrate 20. The remaining portions of multilayer stacks are referred to as multilayer stacks 22' hereinafter. Underlying multilayer stacks 22', some portions of substrate 20 are left, and are referred to as substrate strips 20' hereinafter. Multilayer stacks 22' include semiconductor layers 22A and 22B. Semiconductor layers 22A are alternatively referred to as sacrificial layers, and Semiconductor layers 22B are alternatively referred to as nanostructures hereinafter. The portions of multilayer stacks 22' and the underlying substrate strips 20' are collectively referred to as semiconductor strips 24.

In above-illustrated embodiments, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 3:
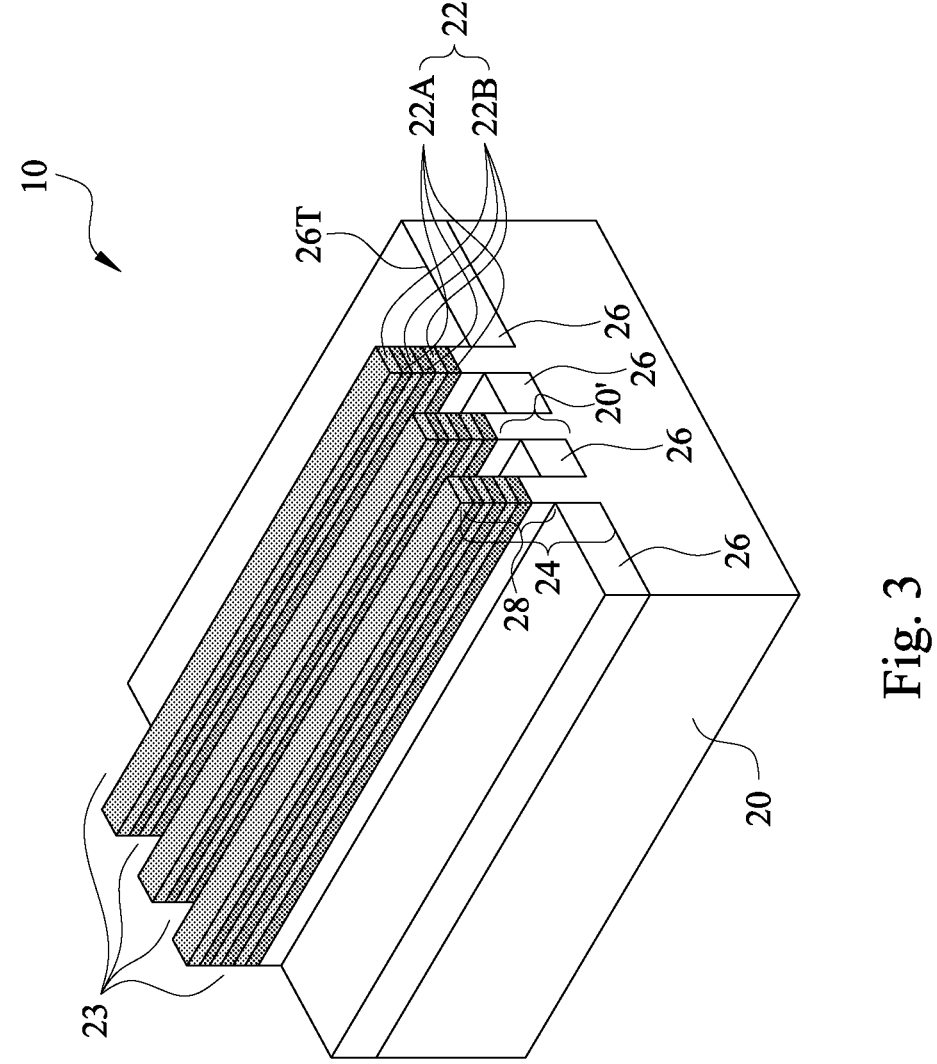

FIG. 3 illustrates the formation of isolation regions 26, which are also referred to as Shallow Trench Isolation (STI) regions throughout the description. The respective process is illustrated as process 206 in the process flow 200 shown in FIG. 23. STI regions 26 may include a liner oxide (not shown), which may be a thermal oxide formed through the thermal oxidation of a surface layer of substrate 20. The liner oxide may also be a deposited silicon oxide layer formed using, for example, ALD, High-Density Plasma Chemical Vapor Deposition (HDPCVD), CVD, or the like. STI regions 26 may also include a dielectric material over the liner oxide, wherein the dielectric material may be formed using Flowable Chemical Vapor Deposition (FCVD), spin-on coating, HDPCVD, or the like. A planarization process such as a Chemical Mechanical Polish (CMP) process or a mechanical grinding process may then be performed to level the top surface of the dielectric material, and the remaining portions of the dielectric material are STI regions 26.

STI regions 26 are then recessed, so that the top portions of semiconductor strips 24 protrude higher than the top surfaces 26T of the remaining portions of STI regions 26 to form protruding fins 28. Protruding fins 28 include multilayer stacks 22' and the top portions of substrate strips 20'. The recessing of STI regions 26 may be performed through a dry etching process, wherein $NF_3$ and $NH_3$, for example, are used as the etching gases. During the etching process, plasma may be generated. Argon may also be included. In accordance with alternative embodiments of the present disclosure, the recessing of STI regions 26 is performed through a wet etching process. The etching chemical may include HF, for example.

Figure 4:
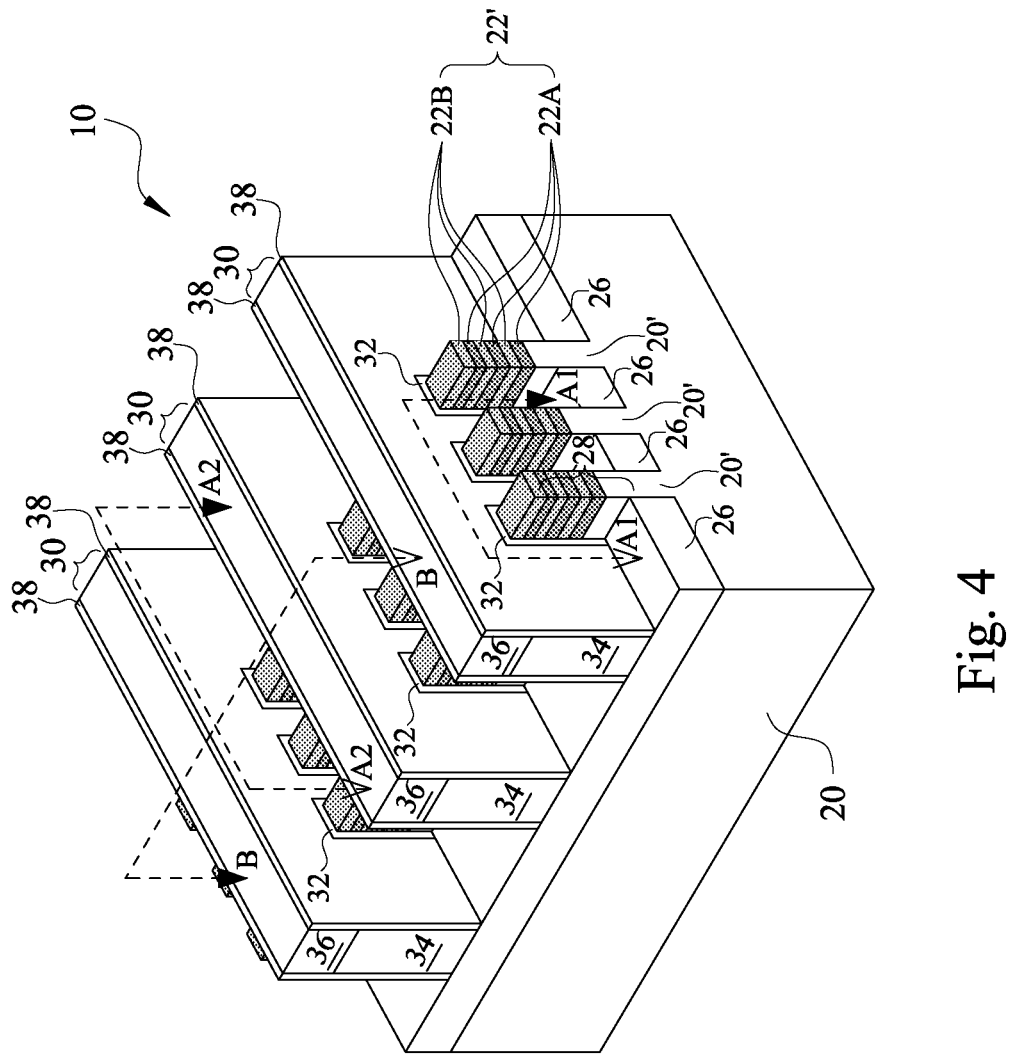

Referring to FIG. 4, dummy gate stacks 30 and gate spacers 38 are formed on the top surfaces and the sidewalls of (protruding) fins 28. The respective process is illustrated as process 208 in the process flow 200 shown in FIG. 23. Dummy gate stacks 30 may include dummy gate dielectrics 32 and dummy gate electrodes 34 over dummy gate dielectrics 32. Dummy gate dielectrics 32 may be formed by oxidizing the surface portions of protruding fins 28 to form oxide layers, or by depositing a dielectric layer such as a silicon oxide layer. Dummy gate electrodes 34 may be formed, for example, using polysilicon or amorphous silicon, and other materials such as amorphous carbon may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, silicon oxy-carbo nitride, or multilayers thereof. Dummy gate stacks 30 may cross over a single one or a plurality of protruding fins 28 and the STI regions 26 between protruding fins 28. Dummy gate stacks 30 also have lengthwise directions perpendicular to the lengthwise directions of protruding fins 28. The formation of dummy gate stacks 30 includes forming a dummy gate dielectric layer, depositing a dummy gate electrode layer over the dummy gate dielectric layer, depositing one or more hard mask layers, and then patterning the formed layers through a pattering process(es).

Next, gate spacers 38 are formed on the sidewalls of dummy gate stacks 30. In accordance with some embodiments of the present disclosure, gate spacers 38 are formed of a dielectric material such as silicon nitride (SiN), silicon oxide ($SiO_2$), silicon carbo-nitride (SiCN), silicon oxyni-tride (SiON), silicon oxy-carbo-nitride (SiOCN), or the like, and may have a single-layer structure or a multilayer struc-ture including a plurality of dielectric layers. The formation process of gate spacers 38 may include depositing one or a plurality of dielectric layers, and then performing an aniso-tropic etching process(es) on the dielectric layer(s). The remaining portions of the dielectric layer(s) are gate spacers 38.

Figure 5B:
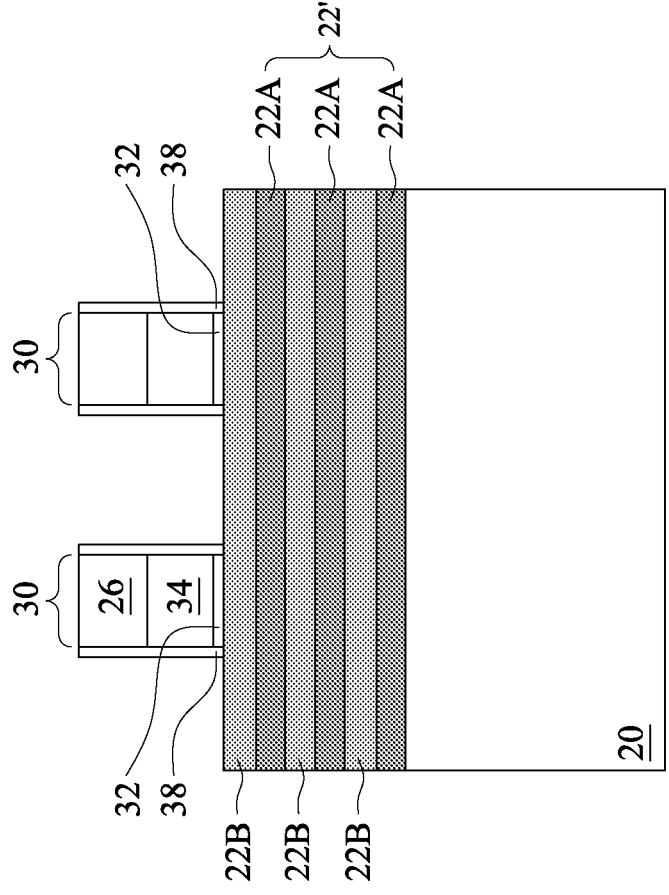
Figure 5A:
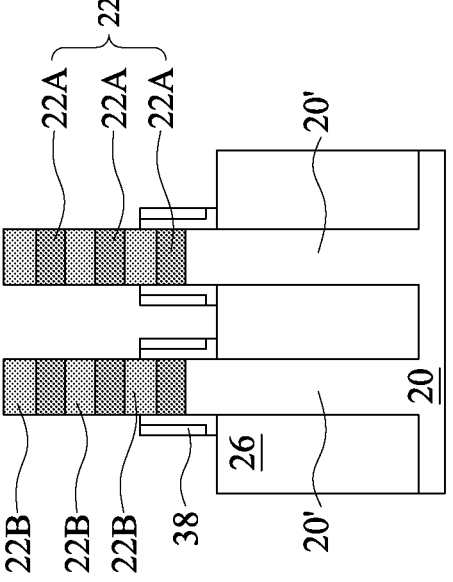

FIGS. 5A and 5B illustrate the cross-sectional views of the structure shown in FIG. 4. FIG. 5A illustrates the reference cross-section A1-A1 in FIG. 4, which cross-section cuts through the portions of protruding fins 28 not covered by dummy gate stacks 30 and gate spacers 38, and is perpendicular to the gate-length direction. Fin spacers 38, which are on the sidewalls of protruding fins 28, are also illustrated. FIG. 5B illustrates the reference cross-section B-B in FIG. 4, which reference cross-section is parallel to the lengthwise directions of protruding fins 28.

Figure 6B:
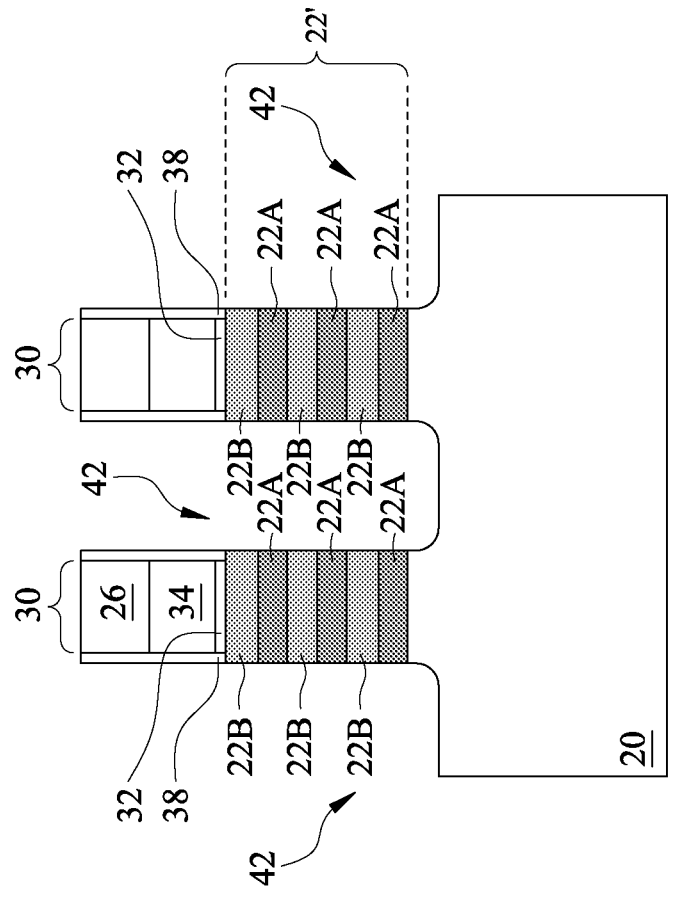
Figure 6A:
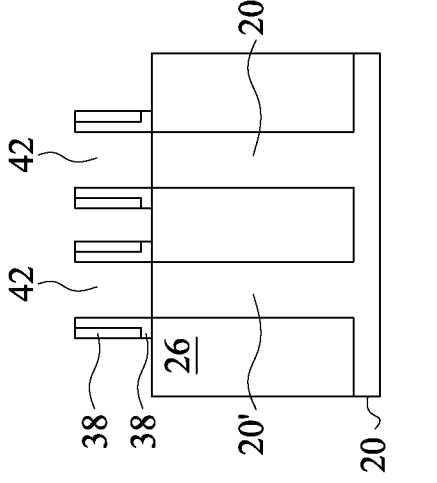

Referring to FIGS. 6A and 6B, the portions of protruding fins 28 that are not directly underlying dummy gate stacks 30 and gate spacers 38 are recessed through an etching process to form recesses 42. The respective process is illustrated as process 210 in the process flow 200 shown in FIG. 23. For example, a dry etch process may be performed using $C_2F_6$, $CF_4$, $SO_2$, the mixture of HBr, $Cl_2$, and $O_2$, the mixture of HBr, $Cl_2$. $O_2$, and $CH_2F_2$, or the like to etch multilayer semiconductor stacks 22' and the underlying substrate strips 20'. The bottoms of recesses 42 are at least level with, or may be lower than (as shown in FIG. 6B), the bottoms of multilayer semiconductor stacks 22'. The etching may be anisotropic, so that the sidewalls of multilayer semiconduc-tor stacks 22' facing recesses 42 are vertical and straight, as shown in FIG. 6B.

Figure 7B:
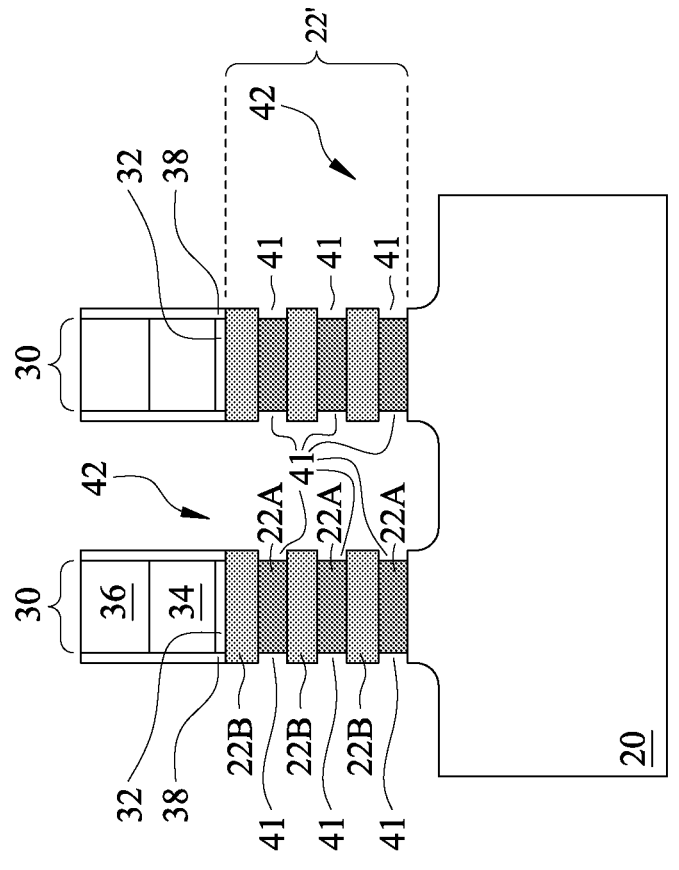
Figure 7A:
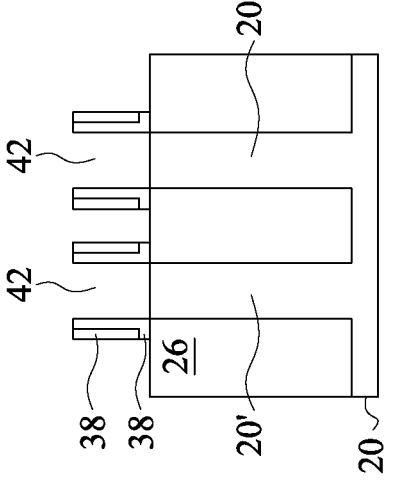

Referring to FIGS. 7A and 7B, sacrificial semiconductor layers 22A are laterally recessed to form lateral recesses 41, which are recessed from the edges of the respective over-lying and underlying nanostructures 22B. The respective process is illustrated as process 212 in the process flow 200 shown in FIG. 23. The lateral recessing of sacrificial semi-conductor layers 22A may be achieved through a wet etching process using an etchant that is more selective to the material (for example, silicon germanium (SiGe)) of sacri-ficial semiconductor layers 22A than the material (for example, silicon (Si)) of the nanostructures 22B and sub-strate 20. For example, in an embodiment in which sacrifi-cial semiconductor layers 22A are formed of silicon germa-nium and the nanostructures 22B are formed of silicon, the wet etching process may be performed using an etchant such as hydrochloric acid (HCl). The wet etching process may be performed using a dip process, a spray process, or the like, and may be performed using any suitable process tempera-tures (for example, between about 400° C. and about 600° C.) and a suitable process time (for example, between about 100 seconds and about 1,000 seconds). In accordance with alternative embodiments, the lateral recessing of sacrificial semiconductor layers 22A is performed through an isotropic dry etching process or a combination of a dry etching process and a wet etching process.

Figure 8B:
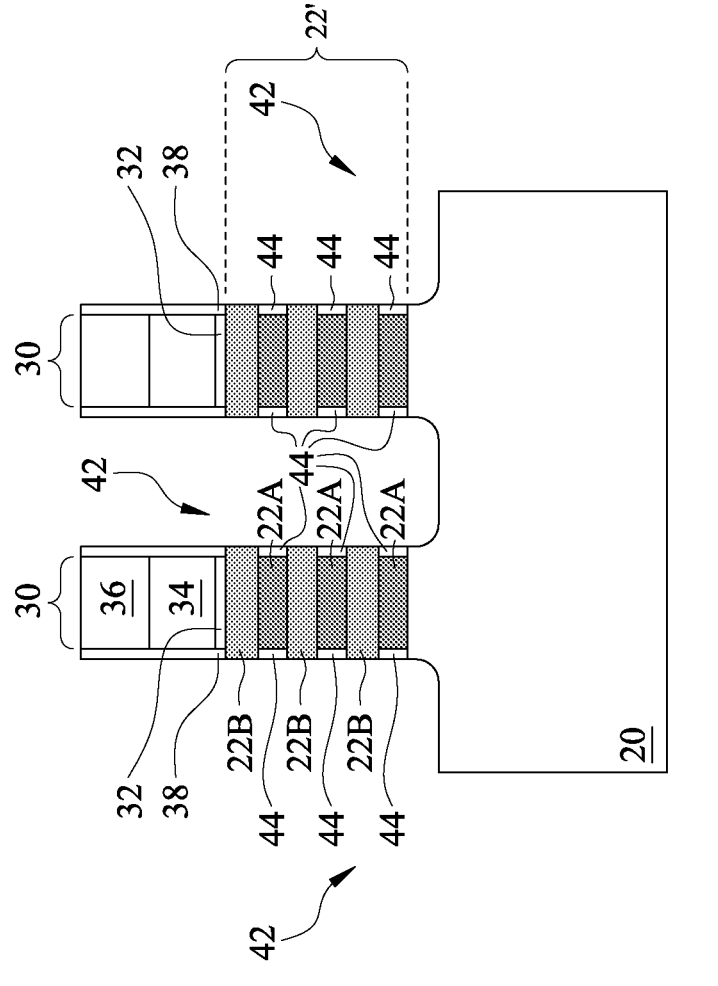
Figure 8A:
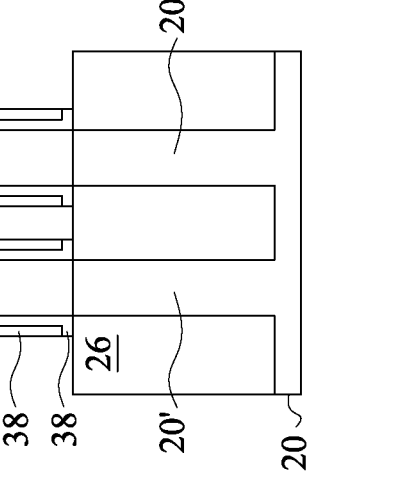

FIGS. 8A and 8B illustrate the formation of inner spacers 44. The respective process is illustrated as process 214 in the process flow 200 shown in FIG. 23. The formation process incudes depositing a spacer layer extending into recesses 41, and performing an etching process to remove the portions of inner spacer layer outside of recesses 41, thus leaving inner spacers 44 in recesses 41. Inner spacers 44 may be formed of or comprise SiOCN, SION, SiOC, SiCN, or the like. Inner spacers 44 may also be porous so that they have a lower-k value lower than, for example, about 3.5. In accordance with some embodiments, the etching of the spacer layer may be performed through a wet etching process, in which the etching chemical may include $H_2SO_4$, diluted HF, ammonia solution ($NH_4OH$, ammonia in water), or the like, or com-binations thereof.

Figure 9B:
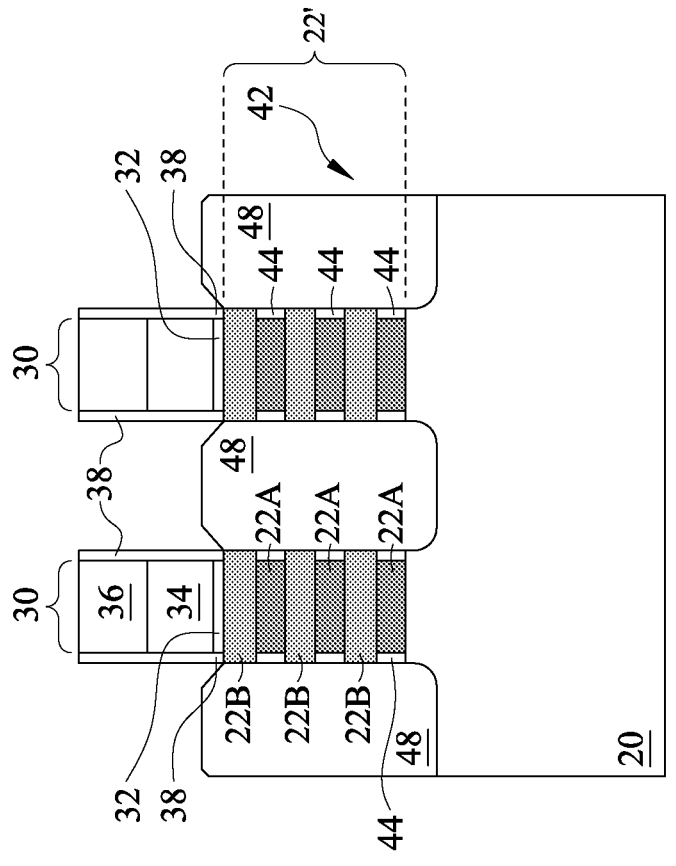
Figure 9A:
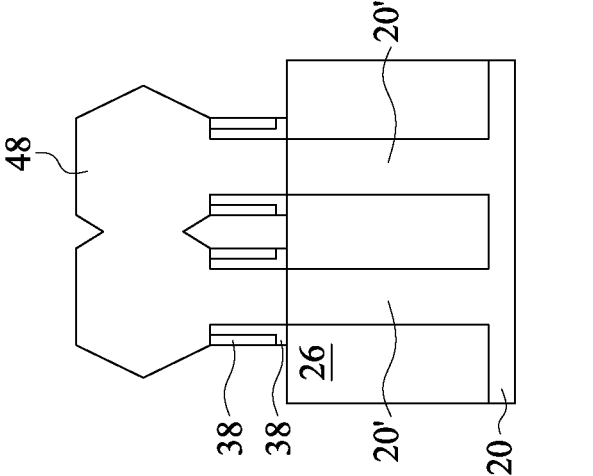

Referring to FIGS. 9A and 9B, epitaxial source/drain regions 48 are formed in recesses 42. The respective process is illustrated as process 216 in the process flow 200 shown in FIG. 23. In accordance with some embodiments, the source/drain regions 48 may exert stress on the nanostruc-tures 22B, which are used as the channels of the correspond-ing GAA transistors, thereby improving performance. In accordance with some embodiments, the corresponding transistor 82 (FIGS. 19A, 19B, and 19C) is an n-type transistor, and epitaxial source/drain regions 48 are accord-ingly formed to be n-type by doping an n-type dopant. For example, silicon phosphorous (SiP), silicon carbon phos-phorous (SiCP), or the like may be grown to form the n-type epitaxial source/drain regions 48. In accordance with alter-native embodiments, the corresponding transistor is a p-type transistor, and epitaxial source/drain regions 48 are accord-ingly formed to be p-type by doping a p-type dopant. For example, silicon germanium boron (SiGeB), silicon boron (SiB), or the like may be grown to form p-type epitaxial source/drain regions 48. After recesses 42 are filled with epitaxy regions 48, the further epitaxial growth of epitaxy regions 48 causes epitaxy regions 48 to expand horizontally, and facets may be formed. The further growth of epitaxy regions 48 may also cause neighboring epitaxy regions 48 to merge with each other.

The subsequent figure numbers in FIGS. 10A, 10B, and 10C through FIGS. 19A, 19B, and 19C may have the corresponding numbers followed by letter A, B, or C. Unless specified otherwise, the letter A indicates that the corre-sponding figure shows a cross-section same as the cross-section A2-A2 in FIG. 4, the letter B indicates that the corresponding figure shows a reference cross-section same as the reference cross-section B-B in FIG. 4, and letter C indicates the corresponding figure (except FIGS. 12C, 13C, 14C, and 17C) shows a cross-section same as the cross-section A1-A1 in FIG. 4.

Figures 10A, 10B:
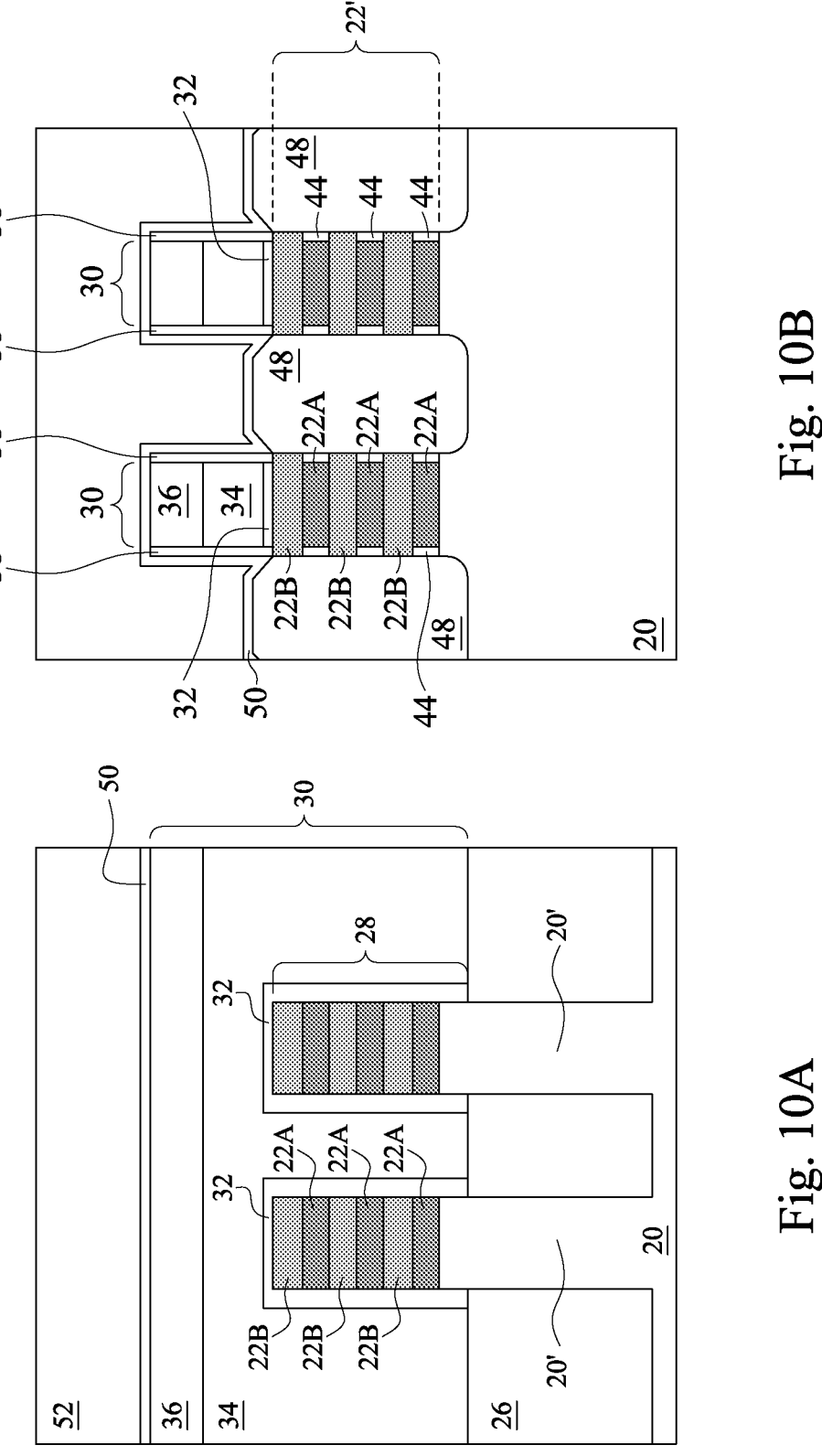
Figure 10C:
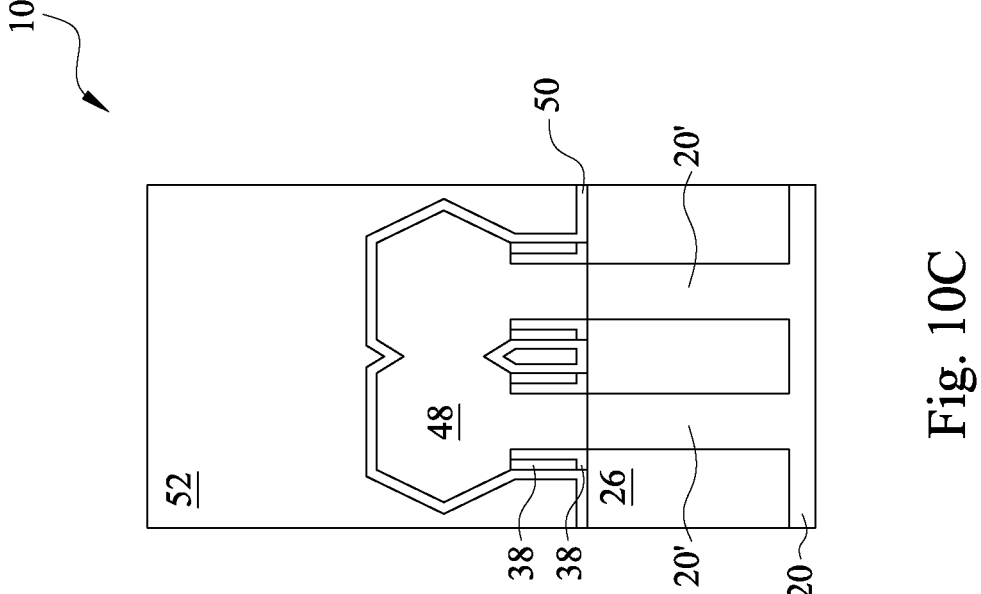

FIGS. 10A, 10B, and 10C illustrate the cross-sectional views of the structure after the formation of Contact Etch Stop Layer (CESL) 50 and Inter-Layer Dielectric (ILD) 52. The respective process is illustrated as process 218 in the process flow 200 shown in FIG. 23. CESL 50 may be formed of silicon oxide, silicon nitride, silicon carbo-nitride, or the like, and may be formed using CVD, ALD, or the like. ILD 52 may include a dielectric material formed using, for example, FCVD, spin-on coating, CVD, or any other suitable deposition method. ILD 52 may be formed of an oxygen-containing dielectric material, which may be a silicon-oxide based material formed using Tetra Ethyl Ortho Silicate (TEOS) as a precursor, Phospho-Silicate Glass (PSG), Boro-Silicate Glass (BSG), Boron-Doped Phospho-Silicate Glass (BPSG), Undoped Silicate Glass (USG), or the like.

Figure 11B:
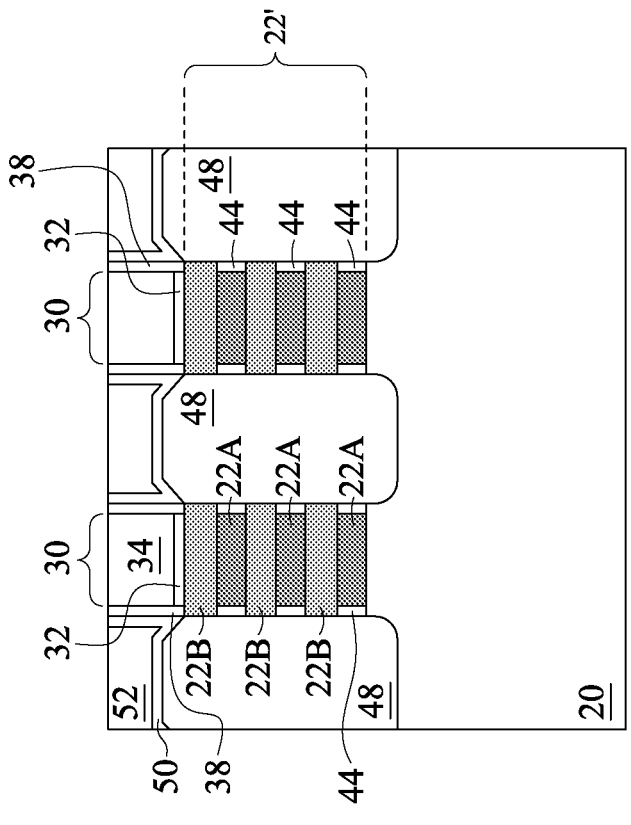
Figure 11A:
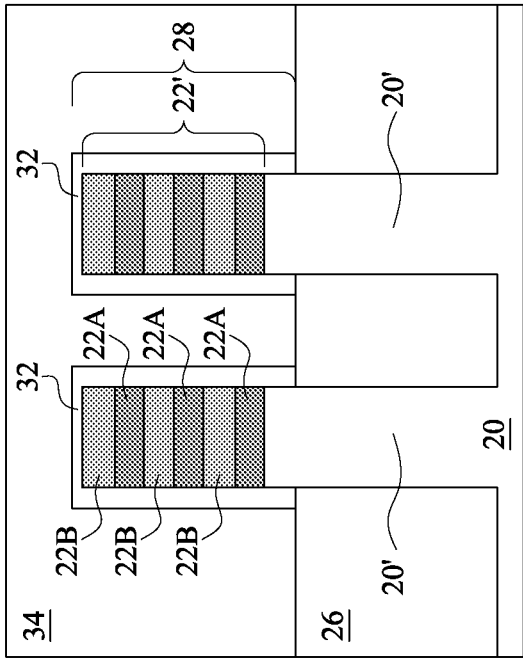

FIGS. 11A and 11B through FIGS. 17A, 17B, 17C, 17D, and 17E illustrate the processes for forming replacement gate stacks. In FIGS. 11A and 11B, a planarization process such as a CMP process or a mechanical grinding process is performed to level the top surface of ILD 52. The respective process is illustrated as process 220 in the process flow 200 shown in FIG. 23. In accordance with some embodiments, the planarization process may remove hard masks 36 to reveal dummy gate electrodes 34, as shown in FIG. 11B. In accordance with alternative embodiments, the planarization process may reveal, and is stopped on, hard masks 36. In accordance with some embodiments, after the planarization process, the top surfaces of dummy gate electrodes 34 (or hard masks 36), gate spacers 38, and ILD 52 are level with each other within process variations.

Figure 12B:
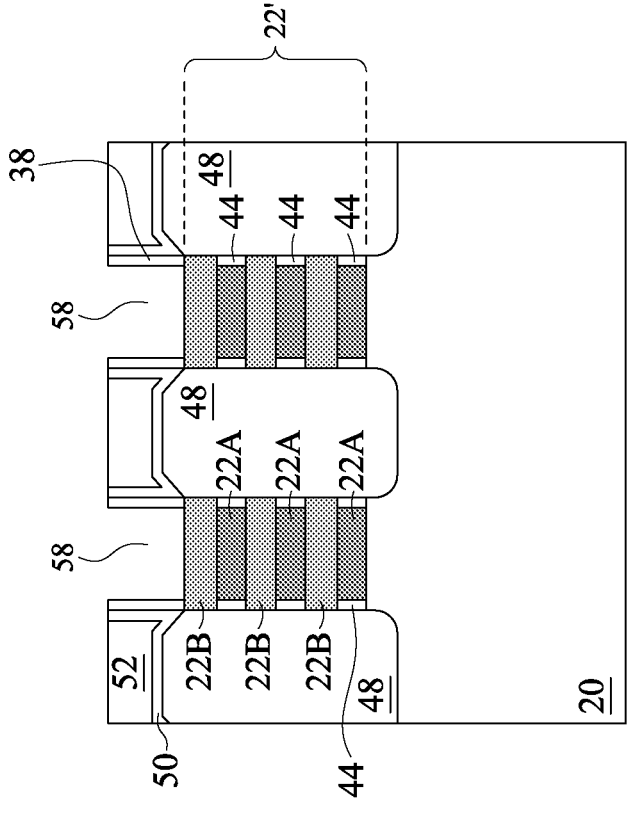
Figure 12A:
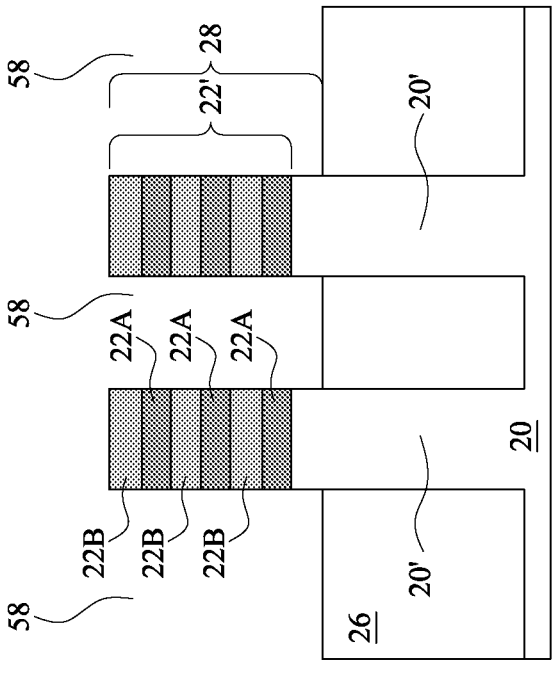
Figure 12C:
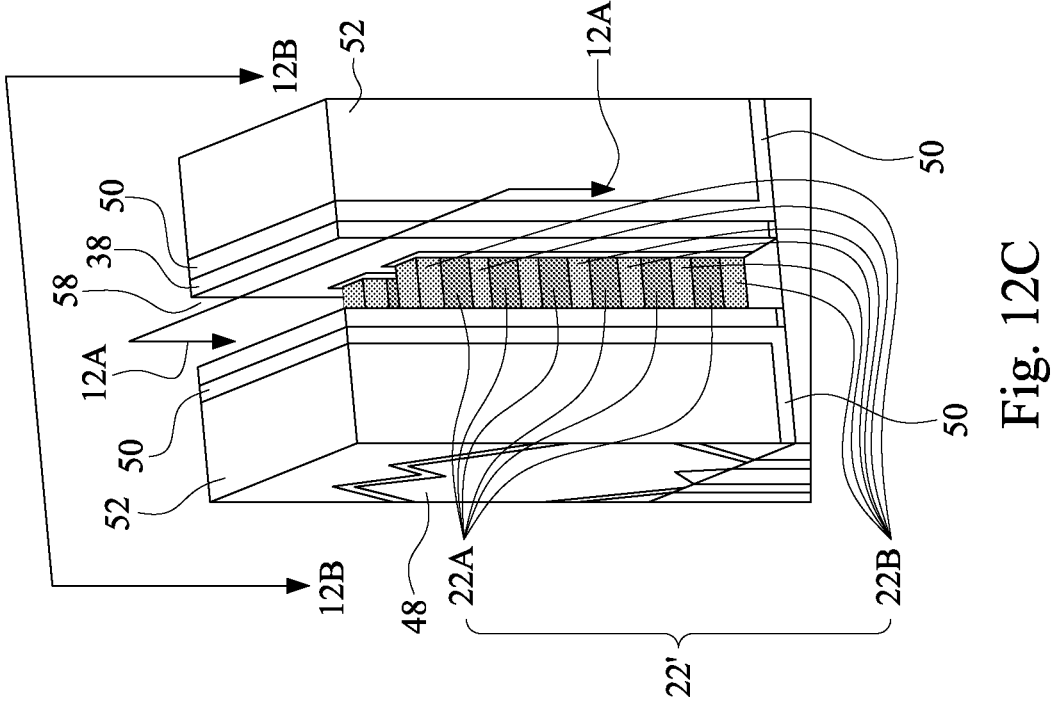

Next, dummy gate electrodes 34 (and hard masks 36, if remaining) are removed in one or more etching processes, so that recesses 58 are formed, as shown in FIGS. 12A, 12B and 12C. The respective process is illustrated as process 222 in the process flow 200 shown in FIG. 23. FIG. 12C illustrates a perspective view of the structure, and FIGS. 12A and 12B illustrate the cross-sectional views 12A-12A and 12B-12B, respectively, in FIG. 12C. The portions of the dummy gate dielectrics 32 in recesses 58 are also removed. In accordance with some embodiments, dummy gate electrodes 34 and dummy gate dielectrics 32 are removed through dry etching processes. For example, the etching process may be performed using reaction gas(es) that selectively etch dummy gate electrodes 34 at a faster rate than ILD 52. Each recess 58 exposes and/or overlies portions of multilayer stacks 22', which include the future channel regions in subsequently completed nano-FETs. The corresponding portions of the multilayer stacks 22' are between neighboring pairs of the epitaxial source/drain regions 48.

Figure 13B:
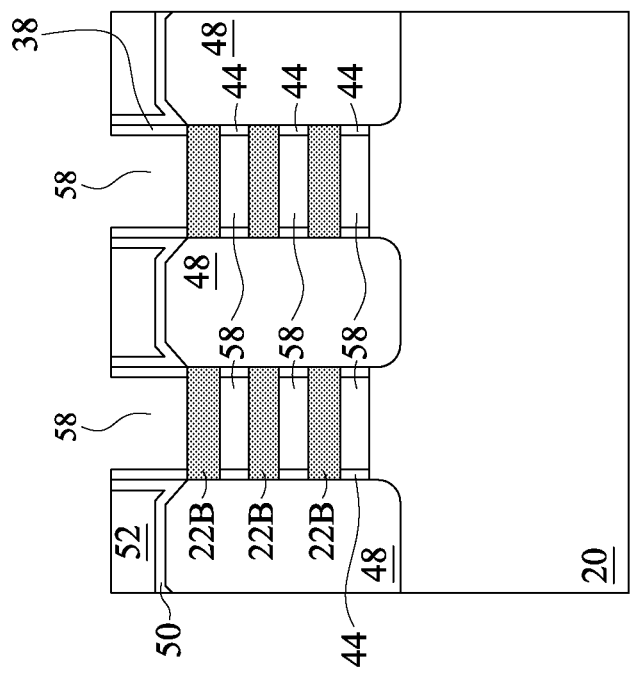
Figure 13A:
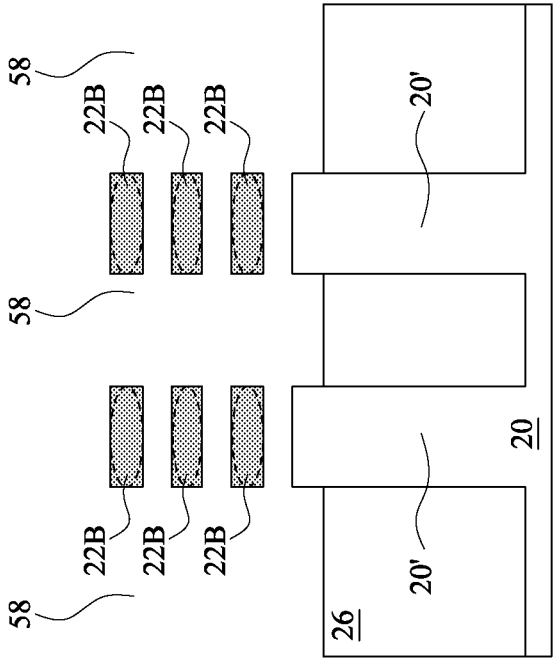
Figure 13C:
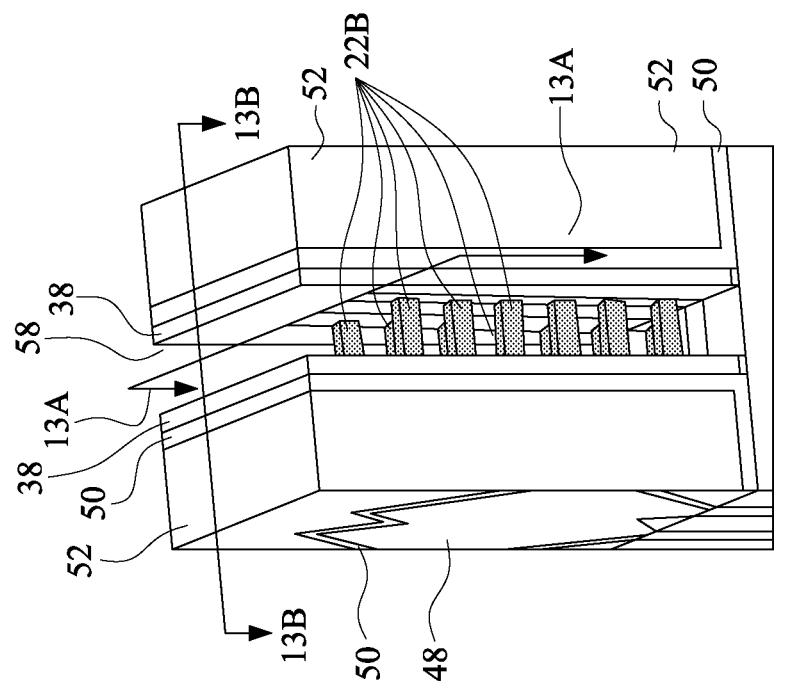

Sacrificial layers 22A are then removed to extend recesses 58 between nanostructures 22B, and the resulting structure is shown in FIGS. 13A, 13B, and 13C. The respective process is illustrated as process 224 in the process flow 200 shown in FIG. 23. FIG. 13C illustrates a perspective view of the structure, and FIGS. 13A and 13B illustrate the cross-sectional views 13A-13A and 13B-13B, respectively, in FIG. 13C. Sacrificial layers 22A may be removed by performing an isotropic etching process such as a wet etching process using etchants which are selective to the materials of sacrificial layers 22A. Nanostructures 22B, substrate 20, STI regions 26 remain relatively un-etched as compared to sacrificial layers 22A. In accordance with some embodiments in which sacrificial layers 22A include, for example, SiGe, and nanostructures 22B include, for example, Si or carbon-doped silicon, tetra methyl ammonium hydroxide (TMAH), ammonium hydroxide ($NH_4OH$), or the like may be used to remove sacrificial layers 22A. It is appreciated that although FIG. 13A and subsequent figures illustrate the cross-sections of nanostructures 22B as being rectangular, nanostructures 22B may have rounded corners, as illustrated by dashed lines in FIG. 13A.

Figures 14A, 14B, 14C:
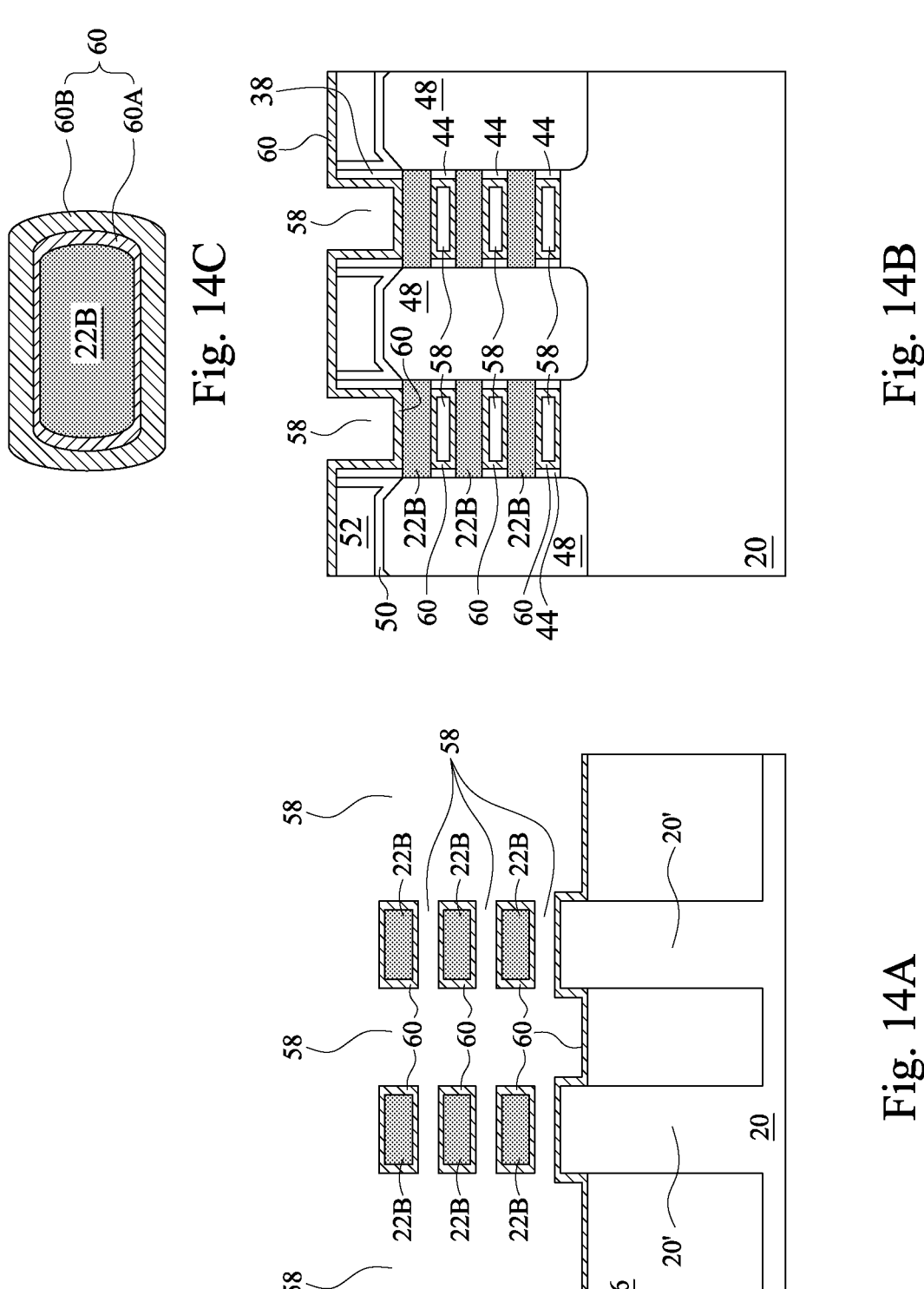

Referring to FIGS. 14A, 14B, and 14C, gate dielectrics 60 are formed. The respective process is illustrated as process 226 in the process flow 200 shown in FIG. 23. The details of an example gate dielectric 60 are shown in FIG. 14C. In accordance with some embodiments, each of gate dielectrics 60 includes interfacial layer 60A (FIG. 14C) and high-k dielectric layer 60B on the interfacial layer 60A. The interfacial layer 60A may be formed of or comprises silicon oxide, which may be deposited through a conformal deposition process such as ALD or CVD. In accordance with some embodiments, the high-k dielectric layers 60B comprise one or more dielectric layers. For example, the high-k dielectric layer(s) 60B may include a metal oxide or a silicate of hafnium, aluminum, zirconium, lanthanum, manganese, barium, titanium, lead, or combinations thereof.

Figures 15A, 15B:
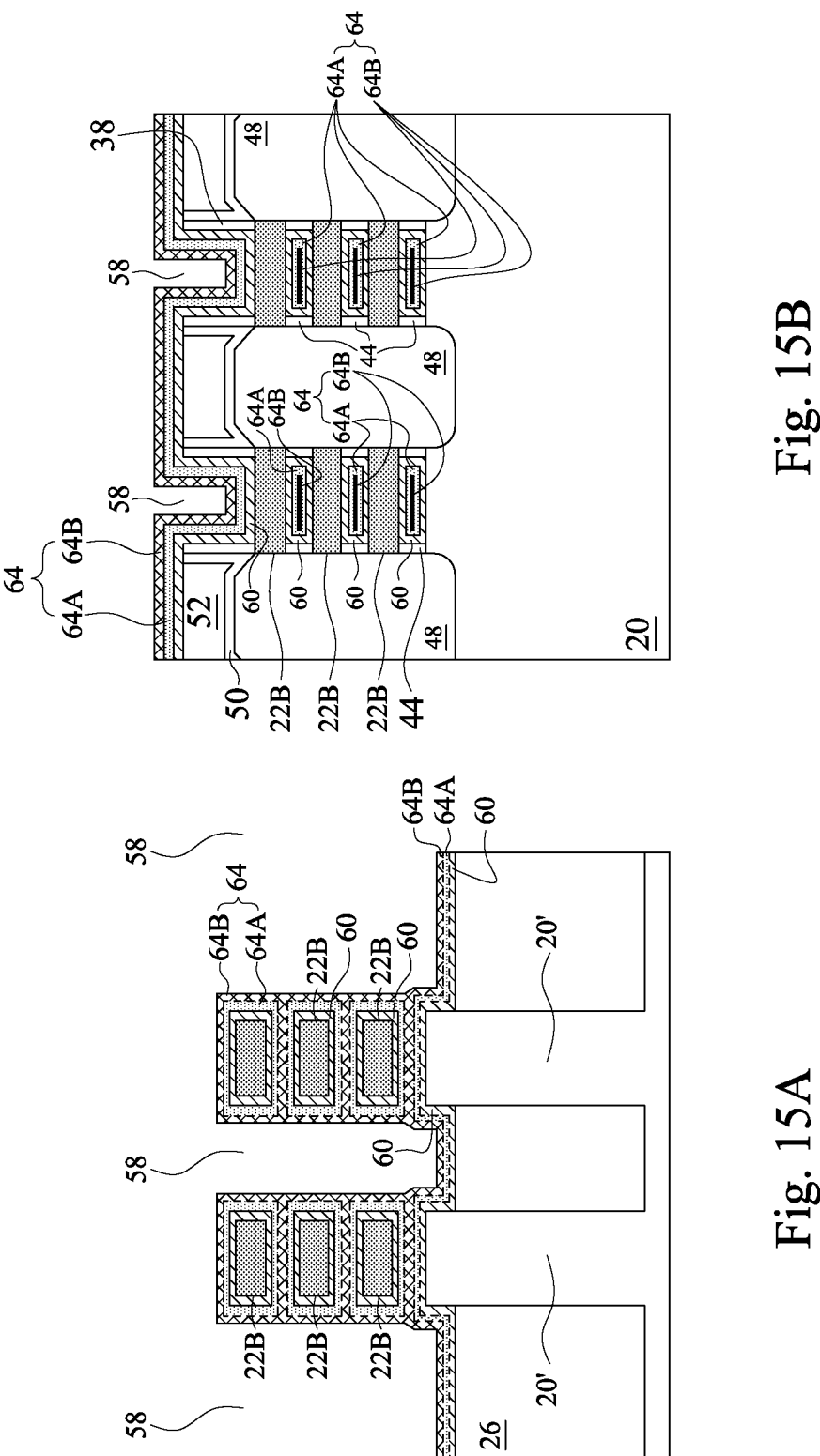

Referring to FIGS. 15A and 15B, work-function layer 64 is deposited, which includes work-function layer 64B, and may or may not include work-function layer 64A. In accordance with some embodiments, work-function layer 64A comprises a metal compound, and is formed first, followed by the formation of work-function layer 64B. In accordance with alternative embodiments, work-function layer 64B is formed to be in physical contact with dielectric layer 60 (and in contact with high-k dielectric layer 60B as shown in FIG. 14C), while work-function layer 64A is not formed. Accordingly, work-function layer 64A is shown as being dashed in FIG. 15A to indicate that it may or may not be formed. In accordance with the embodiments in which both of work-function layers 64A and 64B are formed, the work function of the resulting transistor is affected by both of work-function layers 64A and 64B, and hence the materials of both of work-function layers 64A and 64B determine the threshold voltage of the resulting transistor.

Work-function layer 64B has a mid-gap work function, and work-function layer 64A (when formed) is used to further tune the work function. Accordingly, work-function layer 64B may be used as parts of the work-function layers of both of p-type transistors and n-type transistors (which are formed in the same device die). In accordance with some embodiments, work-function layer 64A comprises a p-type work function material such as TiN, TaN, W, or the like, combinations thereof, and/or multi-layers thereof. The p-type work function material has a work function higher than a mid-gap work-function. In accordance with some embodiments, the mid-gap work-function is equal to or close to about 4.55 eV, and is in the middle between the conduction band of Si (~4.1 eV) and Si valence band (~5 eV). Adopting the p-type work-function material to form work-function layer 64A has the function of increasing the work function of the resulting work-function layer 64. As a result, when the resulting transistor is an n-type transistor (with the source/drain regions being of n-type), the threshold voltage of the resulting n-type transistor is increased. Conversely, when the resulting transistor is a p-type transistor (with the source/drain regions being of p-type), the threshold voltage of the resulting p-type transistor is lowered.

In accordance with alternative embodiments, work-function layer 64A comprises an n-type work function material such as TiAl, TiAlC, TiAlN, or the like, or combinations thereof. The n-type work function material has a work function lower than the mid-gap work-function. Adopting the n-type work-function material to form work-function layer 64A has the function of lowering the work function of the resulting work-function layer 64. As a result, when the resulting transistor is an n-type transistor, the threshold voltage of the n-type transistor is reduced. Conversely, when the resulting transistor is a p-type transistor, the threshold voltage of the p-type transistor is increased.

Accordingly, by forming or not forming work-function layer 64A, and further by selecting the material of work-function layer 64A as either having p-type or n-type work functions, the work-function layer 64A can adjust the work function of work-function layer 64, hence adjust the threshold voltages for both n-type and p-type transistors. This makes it possible to forming multiple transistors in the same die and having multiple levels of threshold voltages, so that different requirement of circuits may be met without increasing the manufacturing cost excessively.

Work-function layer 64A is formed in a conformal deposition process. The respective process is illustrated as process 228 in the process flow 200 shown in FIG. 23. When work-function layer 64A comprises TiN, the deposition is performed using a titanium-containing precursor and a nitrogen-containing precursor. The titanium-containing precursor may include $TiCl_4$, $TiCl_5$, or the like, or combinations thereof. The nitrogen-containing precursor may include $NH_3$. A plurality of ALD cycles are performed, with each including pulsing and purging the titanium-containing precursor, and pulsing and purging the nitrogen-containing precursor.

In accordance with some embodiments, in which the deposition of TiN for work-function layer 64A is performed using $TiCl_4$ and $NH_3$ as process gases, and when ALD is used, the temperature of wafer 10 may be in the range between about 270° C. and about 550° C. The chamber pressure may be in the range between about 0.5 Torr and about 50 Torr.

When work-function layer 64A comprises TaN, the deposition is performed using a tantalum-containing precursor and a nitrogen-containing precursor. The tantalum-containing precursor may include $TaCl_4$, $TaCl_5$, or the like, or combinations thereof. The nitrogen-containing precursor may include $NH_3$. A plurality of ALD cycles may be performed, with each including pulsing and purging the tantalum-containing precursor, and pulsing and purging the nitrogen-containing precursor.

Work-function layer 64B is also formed in a conformal deposition process. The respective process is illustrated as process 230 in the process flow 200 shown in FIG. 23. In accordance with some embodiments, work-function layer 64B includes an elemental metal that is not in the form of any chemical compound. The elemental metal in work-function layer 64B may include ruthenium, molybdenum, or alloys thereof. work-function layer 64B may include pure or substantially pure (or example, with atomic percentage greater than about 90 percent) metal such as ruthenium and/or molybdenum.

Work-function layer 64B may be deposited using CVD. ALD, PECVD. PEALD, Metal Organic CVD (MOCVD), or the like. In accordance with some embodiments in which work-function layer 64B comprises ruthenium, the precursor may include $Ru_3(CO)_{12}$. $Ru(C_6H_6)(C_6H_8)$, $Ru(C_5H_7O_2)_3$, $Ru(CO)_3(C_6H_8)$, $Ru(C_5H_4C_2H_5)_2$, or the like, or combinations thereof. The precursor may also include $H_2$, $N_2$, Ar, or the like. Carrier gases such as argon, nitrogen ($N_2$), or the like may also be included.

In accordance with some embodiments in which work-function layer 64B comprises molybdenum, the precursor may include molybdenum chlorides. The precursor may also include $H_2$. Carrier gases such as argon, nitrogen ($N_2$), or the like may also be included.

The process conditions in the deposition of work-function layer 64B affect the result, and are controlled to be in certain range. For example, for the deposition of ruthenium or molybdenum, when the wafer temperature is too low, the deposition of ruthenium/molybdenum will not occur. When the wafer temperature is too high, ruthenium/molybdenum particles will be generated, and the uniformity of work-function layer 64B is adversely affected. In accordance with some embodiments in which ruthenium is deposited, the wafer temperature may be in the range between about 80° C. and about 300° C. In accordance with alternative embodiments in which molybdenum is deposited, the wafer temperature may be in the range between about 80° C. and about 700° C.

The chamber pressure in the chamber for depositing work-function layer 64B is also controlled to be in certain range. when the chamber pressure is too low, ruthenium/molybdenum will not be deposited. When the chamber pressure is too high, ruthenium/molybdenum particles will be generated, and the uniformity of work-function layer 64B is adversely affected. In accordance with some embodiments in which ruthenium is deposited, the chamber pressure is in the range between about 0.1 Torr and about 10 Torr. In accordance with alternative embodiments in which molybdenum is deposited, the chamber pressure is in the range between about 0.1 Torr and about 50 Torr.

It is appreciated that the work function of work-function layer 64B may be affected by the material of the overlying and underlying layers. In accordance with some embodiments, work-function layer 64B, when comprising ruthenium and/or molybdenum, may have a work function in the range between about 4.65 eV and about 5.2 eV.

The thickness of each of work-function layers 64A and 64B may be greater than about 5 Å. Otherwise, the coverage of work-function layers 64A and 64B may not be good enough. In accordance with some embodiments, work-function layer 64 has a total thickness in the range between about 5 Å and about 50 Å. The thickness of work-function layer 64A (when formed) may be in the range between about 5 Å and about 20 Å. The thickness of work-function layer 64B may be in the range between about 5 Å and about 30 Å. When work-function layer 64A is formed, both of work-function layer 64A and work-function layer 64B are thinner in order to be accommodated into the space between neighboring nanostructures 22B. On the other hand, if work-function layer 64A is not formed, work-function layer 64B can be formed thicker, and extends to, and is in physical contact with, the high-k dielectric layers 60B on neighboring nanostructures 22B. The thickness ratio of the thickness of work-function layer 64A (if formed) to the thickness of work-function layer 64B may be in the range between about 0.1 and about 5.

Figures 16A, 16B:
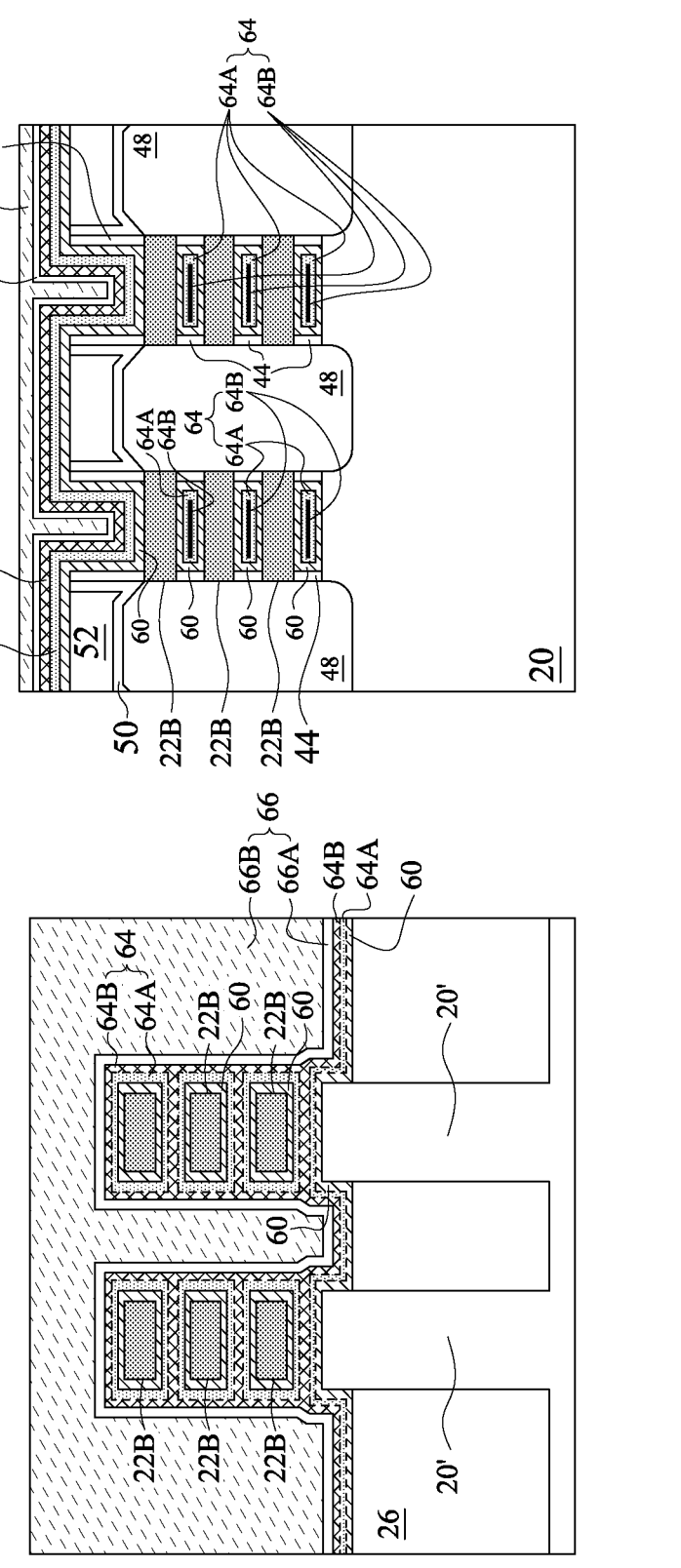

FIGS. 16A and 16B illustrate the deposition of conductive filling layers 66 to fully fill the remaining recesses 58. The respective process is illustrated as process 232 in the process flow 200 shown in FIG. 23. Conductive filling layers 66 are away from semiconductor regions 24' far enough, so that conductive filling layers 66 do not act as the work-function layers. The deposition may include CVD, ALD, etc. In accordance with some embodiments, conductive filling layers 66 includes glue layer 66A (FIG. 16B), and filling material 66B over glue layer 66A. Glue layer 66A may be formed of or comprises TiN, TaN, WN, WCN, TiCN, or the like, or combinations thereof. Glue layer 66A may be in physical contact with work-function layer 64B. Filling material 66B may include tungsten, cobalt, aluminum, or the like.

Figures 17A, 17B:
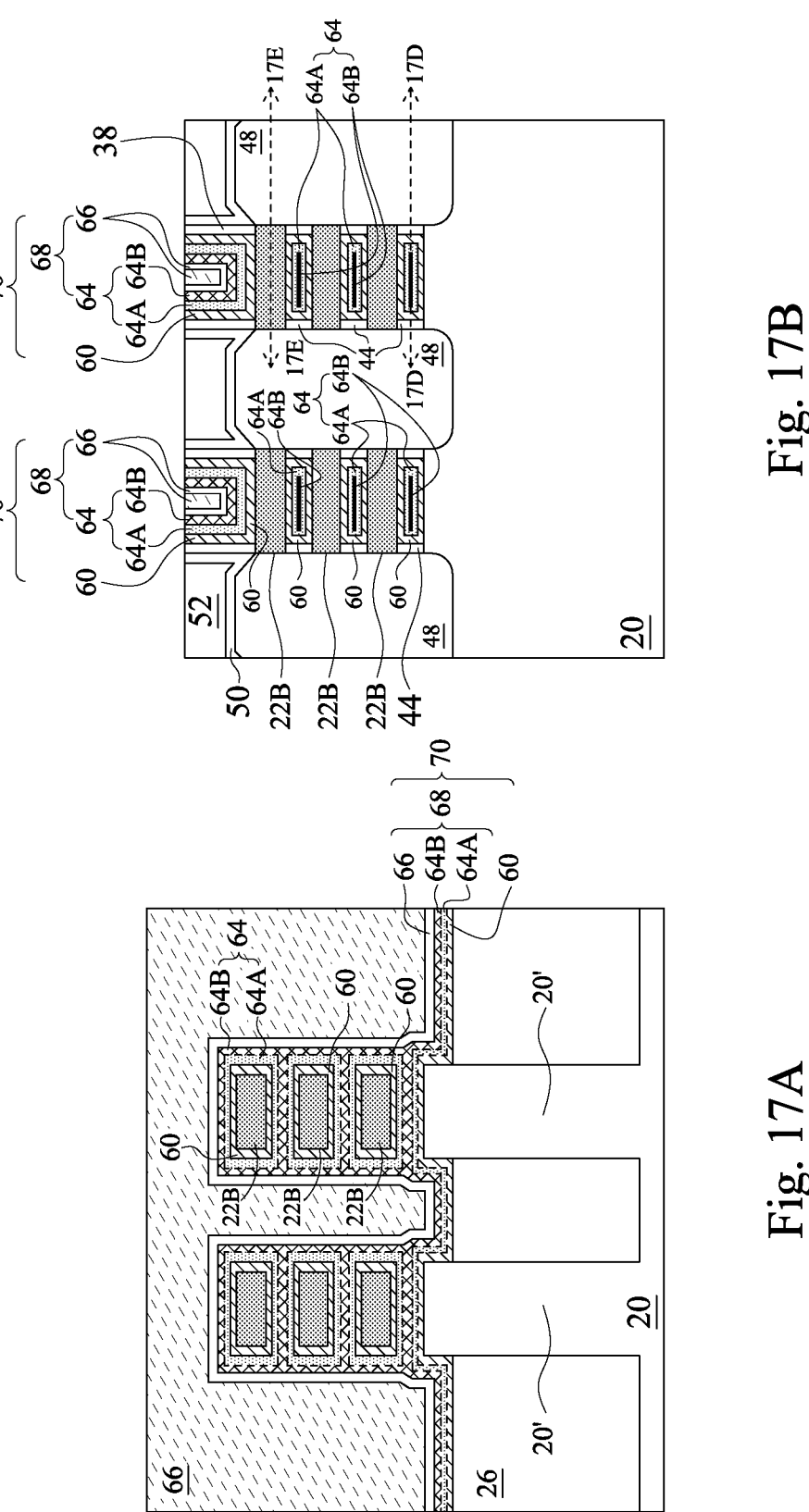

After the deposition of conductive filling layers 66, a planarization process such as a CMP process or a mechanical grinding process is performed to remove the excess portions of the gate dielectrics 60, work-function layer 64, and conductive filling layers 66, which excess portions are over the top surface of ILD 52. The respective process is also illustrated as process 232 in the process flow 200 shown in FIG. 23. The resulting structure is shown in FIGS. 17A and 17B. The remaining conductive filling layers 66 and work-function layer 64 are collectively referred to as gate electrodes 68. Gate electrodes 68 and gate dielectrics 60 are collectively referred to as gate stacks 70 of the resulting nano-FETs.

FIG. 17C illustrates a perspective view of the structure shown in FIGS. 17A and 17B, wherein the cross-sectional views shown in FIGS. 17A and 17B are obtained from the cross-sections 17A-17A and 17B-17B, respectively, in FIG. 17C. FIGS. 17D and 17E illustrate the horizontal cross-sectional views of the structure shown in FIGS. 17A, 17B, and 17C, wherein the horizontal cross-sectional views are obtained from the horizontal planes 17D-17D and 17E-17E, respectively, in FIG. 17B.

Figures 18A, 18B:
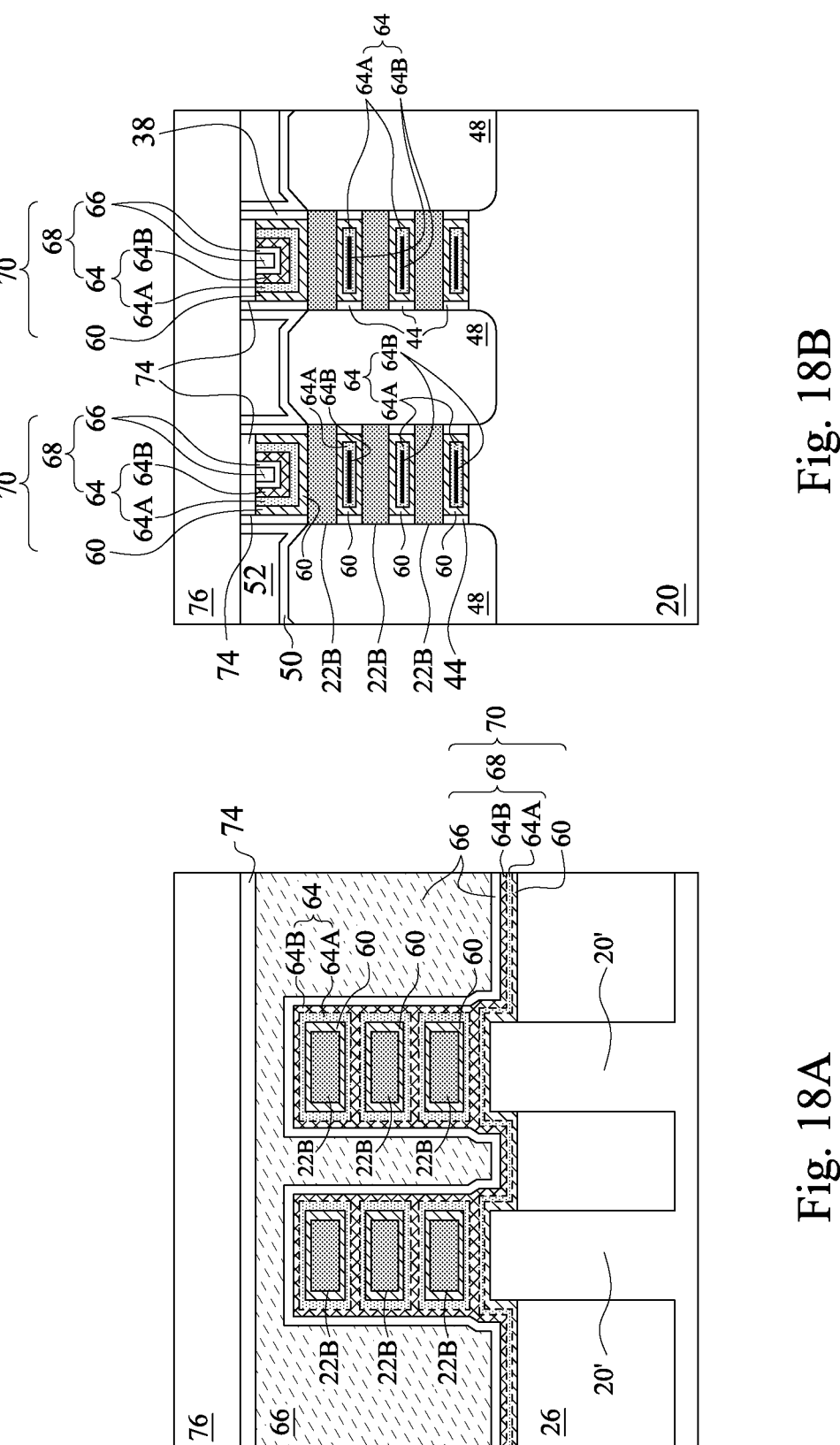
Figure 18C:
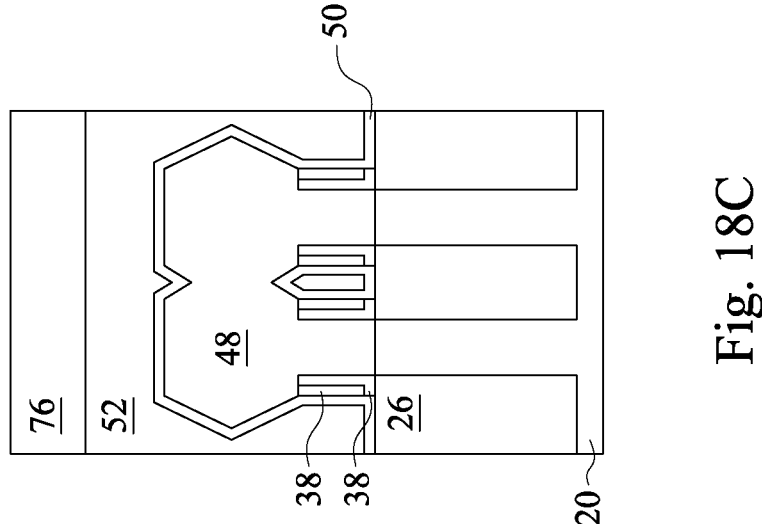

In the processes shown in FIGS. 18A, 18B, and 18C, gate stacks 70 (including gate dielectrics 60 and the corresponding overlying gate electrodes 68) are recessed, so that recesses are formed directly over gate stacks 70 and between opposing portions of gate spacers 38. A gate mask 74 comprising one or more layers of dielectric material, such as silicon nitride, silicon oxynitride, or the like, is filled in each of the recesses, followed by a planarization process to remove excess portions of the dielectric material extending over ILD 52. The respective process is illustrated as process 234 in the process flow 200 shown in FIG. 23. Subsequently formed gate contacts (such as the gate contact plugs 80A and 80B, discussed below with relative to FIGS. 19A and 19B) penetrate through the gate mask 74 to contact the top surface of the recessed gate electrodes 68.

As further illustrated by FIGS. 18A, 18B, and 18C. ILD 76 is deposited over ILD 52 and over gate masks 74. The respective process is illustrated as process 236 in the process flow 200 shown in FIG. 23. An etch stop layer (not shown), may be, or may not be deposited before the formation of ILD 76. In accordance with some embodiments, ILD 76 is formed through FCVD, CVD, PECVD, or the like. ILD 76 is formed of a dielectric material, which may be selected from silicon oxide, PSG, BSG, BPSG. USG, or the like.

Figures 19A, 19B:
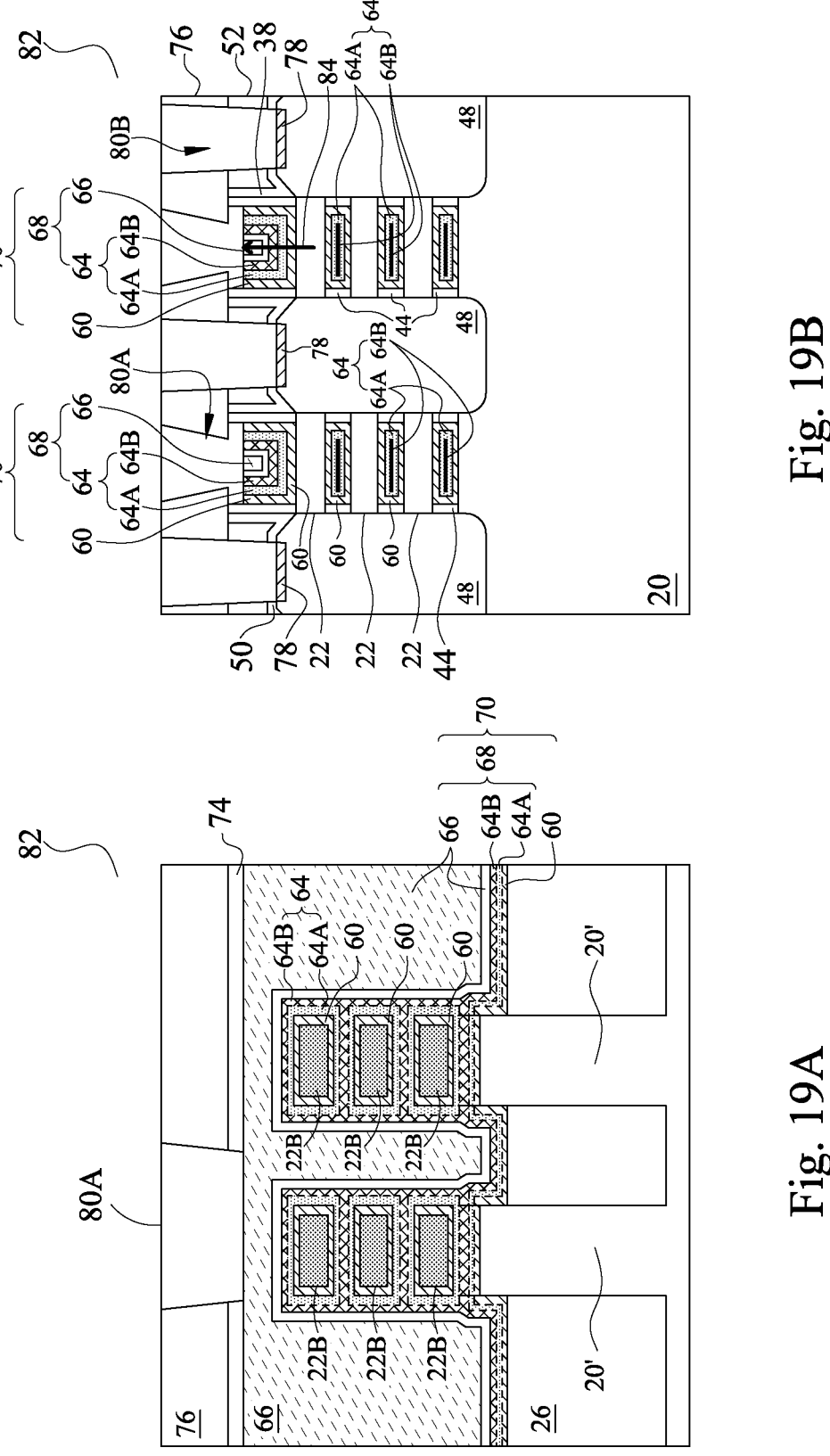
Figure 19C:
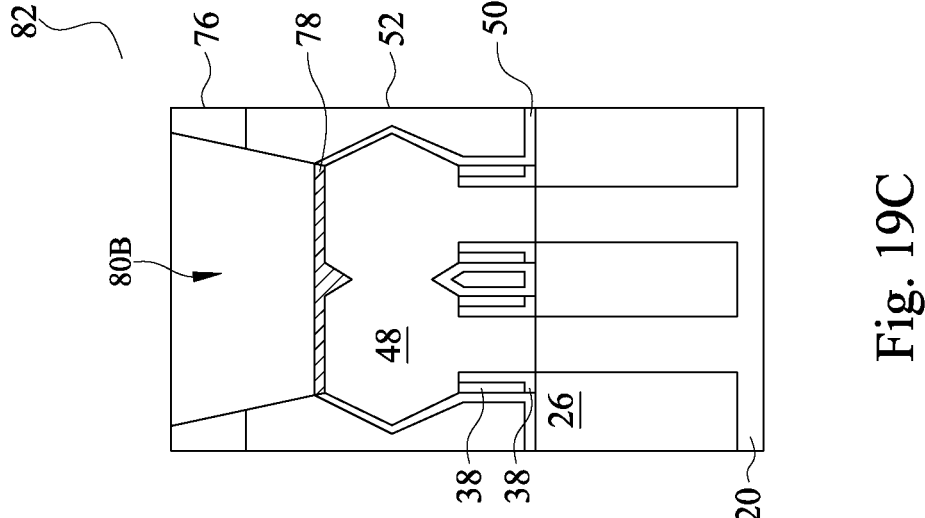

In FIGS. 19A, 19B, and 19C, ILD 76, ILD 52, CESL 50, and gate masks 74 are etched to form recesses (occupied by contact plugs 80A and 80B) exposing surfaces of the epitaxial source/drain regions 48 and/or gate stacks 70. The recesses may be formed through etching using an anisotropic etching process, such as RIE, NBE, or the like. In accordance with some embodiments, the recesses may be formed by etching-through ILD 76 and ILD 52 using a first etching process, etching-through gate masks 74 using a second etching process, and etching-through CESL 50 possibly using a third etching process. Although FIG. 19B illustrates that contact plugs 80A and 80B are in a same cross-section, in various embodiments, contact plugs 80A and 80B may be formed in different cross-sections, thereby reducing the risk of shorting with each other.

After the recesses are formed, silicide regions 78 (FIGS. 19B and 19C) are formed over the epitaxial source/drain regions 48. The respective process is illustrated as process 238 in the process flow 200 shown in FIG. 23. In accordance with some embodiments, silicide regions 78 are formed by first depositing a metal layer (not shown) capable of reacting with the semiconductor materials of the underlying epitaxial source/drain regions 48 (for example, silicon, silicon germanium, germanium) to form silicide and/or germanide regions, then performing a thermal anneal process to form silicide regions 78. The metal may include nickel, cobalt, titanium, tantalum, platinum, tungsten, or the like. The un-reacted portions of the deposited metal are then removed, for example, by an etching process.

Contact plugs 80B are then formed over silicide regions 78. Also, contact plugs 80A (may also be referred to as gate contact plugs) are also formed in the recesses, and are over and contacting gate electrodes 68. The respective processes are illustrated as process 240 in the process flow 200 shown in FIG. 23. Contact plugs 80A and 80B may each comprise one or more layers, such as a barrier layer, a diffusion layer, and a fill material. For example, in accordance with some embodiments, contact plugs 80A and 80B each includes a barrier layer and a conductive material, and are electrically coupled to the underlying conductive feature (for example, gate stacks 70 and/or silicide region 78 in the illustrated embodiment). The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP process, may be performed to remove excess material from a surface of ILD 76. Nano-FET 82 is thus formed.

Figure 20:
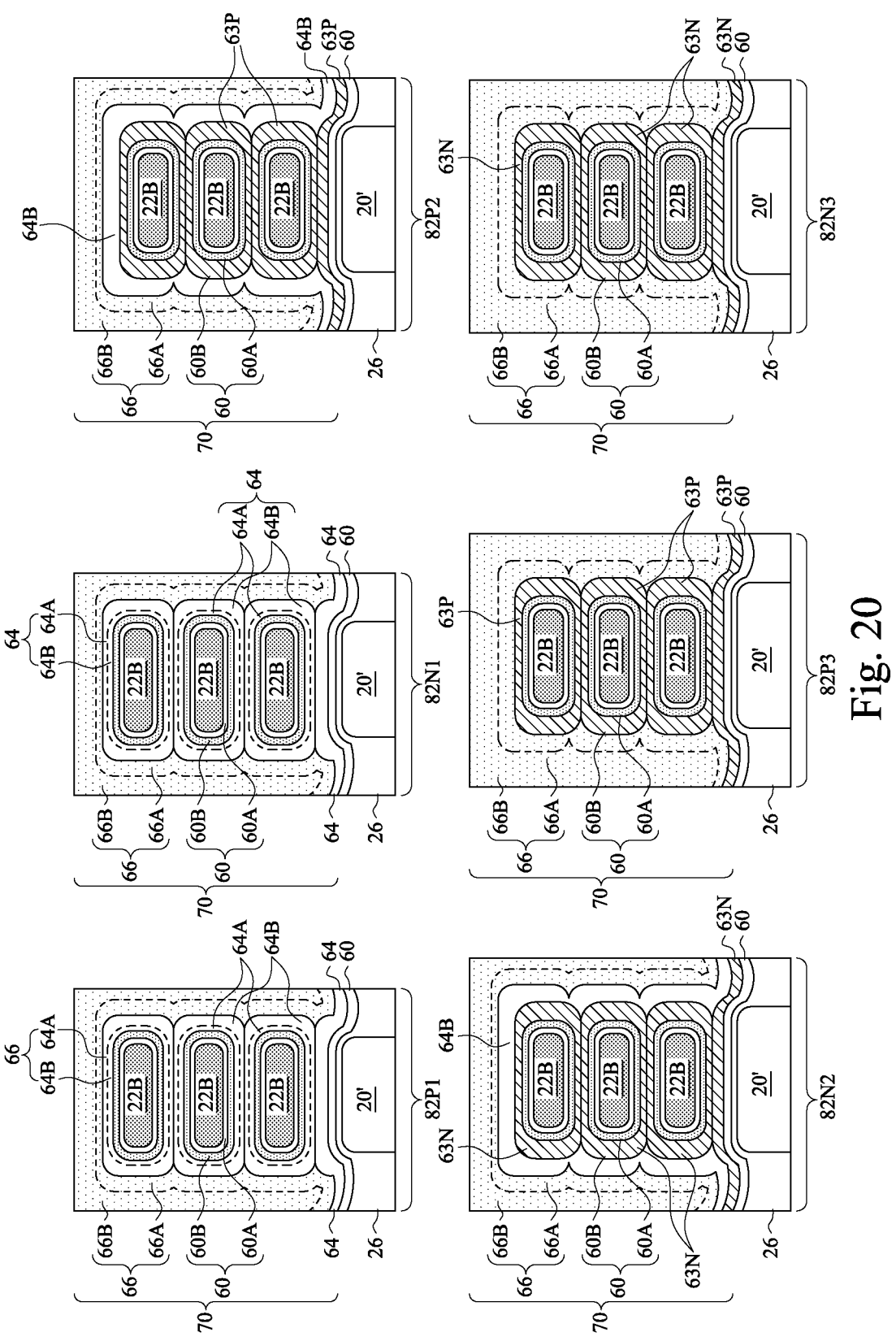
FIG. 20 illustrates the gate stacks of several transistors having different gate stacks in accordance with some embodiments.

By adopting the work-function layer 64B comprising ruthenium and/or molybdenum, some transistors have mid-gap work functions may be formed in the same wafer and the same die. The transistors may have work-functions and threshold voltages tuned by forming or not forming work-function layer 64A, and by selecting materials for work-function layer 64A, as discussed in preceding paragraphs. Some other transistors may not have work-function layer 64B, but may have work-function layer 64A. For example, FIG. 20 illustrates the cross-sectional views of some transistors, which may be formed in the same device die and on the same substrate 20. The formation of the transistors may share common formation processes including the deposition of gate dielectrics 60, work-function layers 64A, 64B, p-type work-function layer 63P (in transistor 82P3), n-type work-function layer 63N (transistor 82N3), glue layer 66A, and filling material 66B.

Transistor 82P1 is a p-type transistor, whose source/drain regions 48 (FIG. 19B) are of p-type. Transistor 82N1 is an n-type transistor, whose source/drain regions 48 (FIG. 19B) are of n-type. The work-function layer 64B of transistors 82P1 and 82N1 may be formed in a common deposition process. Each of transistors 82P1 and 82N1 may or may not include work-function layer 64A. Furthermore, the work-function layer 64A of transistors 82P1 may be the same as or different from (having different work functions) the work-function layer 64A of transistors 82N1. When the work-function layer 64A of transistors 82P1 is the same as the work-function layer 64A of transistors 82N1, the entire gate stacks 70 of transistors 82P1 and 82N1 may share common formation processes.

Transistor 82P2 is a p-type transistor, and transistor 82N2 is an n-type transistor. In these transistors, metal layers 64B are formed, but do not act as the work-function layers. Rather, work-function layers 63P and 63N are formed as work-function layers. Since metal layers 64B are out of the range for them to function as work-function layers, they don't have effect (or have little effect) on the threshold voltages of transistors 82P2 and 82N2. In accordance with some embodiments, the formation of transistors 82P1 and 82P2 share some common processes, and the formation processes may include, after forming high-k dielectric layers 60B for both of transistors 82P1 and 82P2, depositing a p-type work-function layer 63P on the high-k dielectric layers 60B of both of transistors 82P1 and 82P2, followed by an etching process to remove the portion of work-function layer 63P for transistor 82P1, while leaving the portion of work-function layer 63P for transistor 82P2. In accordance with these embodiments, work-function layer 64A will not be formed for transistor 82P1. Metal layer 64B may then be deposited for both of transistors 82P1 and 82P2, which acts as the work-function layer for transistor 82P1, but not for transistor 82P2. The formation of gate stacks for transistors 82N1 and 82N2 may be similar to the above-discussed formation processes of gate stacks for transistors 82P1 and 82P2, except that instead of p-type work-function layer 63P, an n-type work-function layer 63N is formed.

Transistor 82P3 is a p-type transistor, and transistor 82N3 is an n-type transistor. The formation of transistors 82P3 and 82N3 are similar to the formation of, and may share common formation processes as, the transistors 82P2 and 82N2, respectively. In the formation of transistors 82P3 and 82N3, an additional etching process is performed after the deposition of the corresponding metal layer 64B, so that the metal layer 64B is removed from transistors 82P3 and 82N3, but remain in transistors 82P2 and 82N2.

Figure 21:
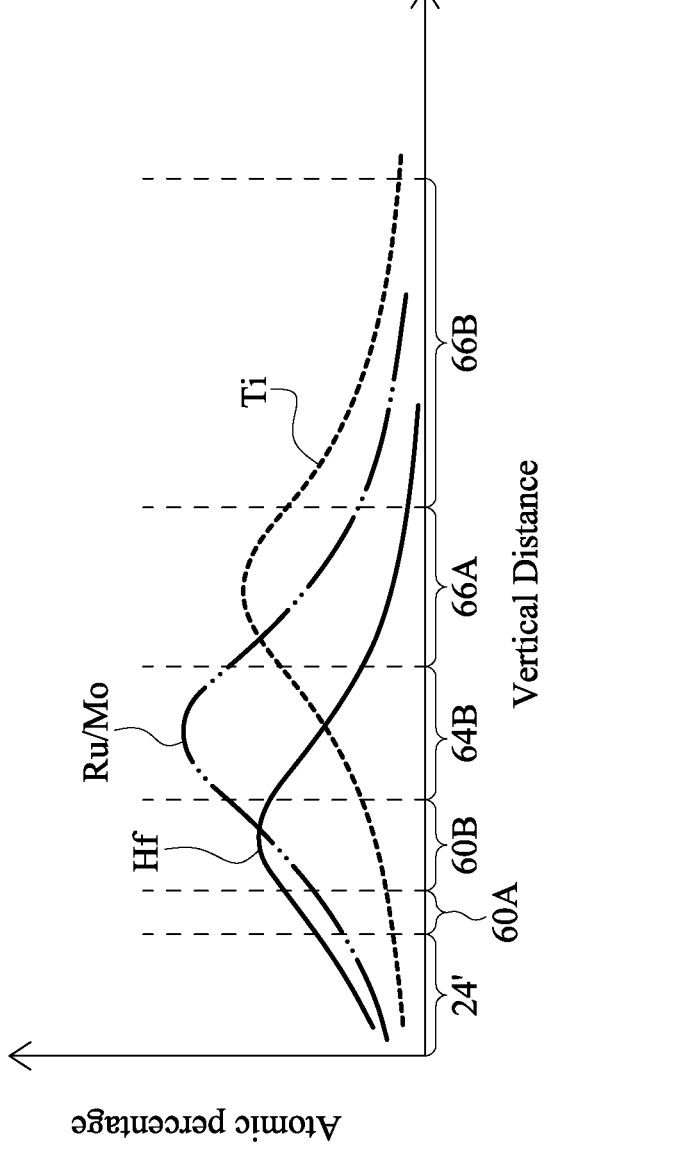
FIGS. 21 and 22 illustrate the distribution of the atomic percentages of several elements in gate stacks in accordance with some embodiments.

FIG. 21 schematically illustrates the Ru/Mo atomic percentage (in work-function layer 64B), titanium atomic percentage (in glue layer 66A), and hafnium atomic percentage (in high-k dielectric layer 60B) in gate stacks 70 (FIG. 19B) as functions of vertical distance from nanostructure 22B. FIG. 21 corresponds to the embodiments in which work-function layer 64A is not formed, and work-function layer 64B contacts high-k dielectric layer 60B. The X-axis represents the vertical distance in the direction of arrow 84 in FIG. 19B. In accordance with some embodiments, although the elements in gate stack 70 diffuse away from where they are deposited, the Ru/Mo atomic percentage has a peak value in work-function layer 64B. The titanium atomic percentage has a peak value in glue layer 66A assuming glue layer 66A comprises titanium. The hafnium atomic percentage has a peak value in high-k dielectric layer 60B assuming high-k dielectric layer 60B comprises hafnium.

Figure 22:
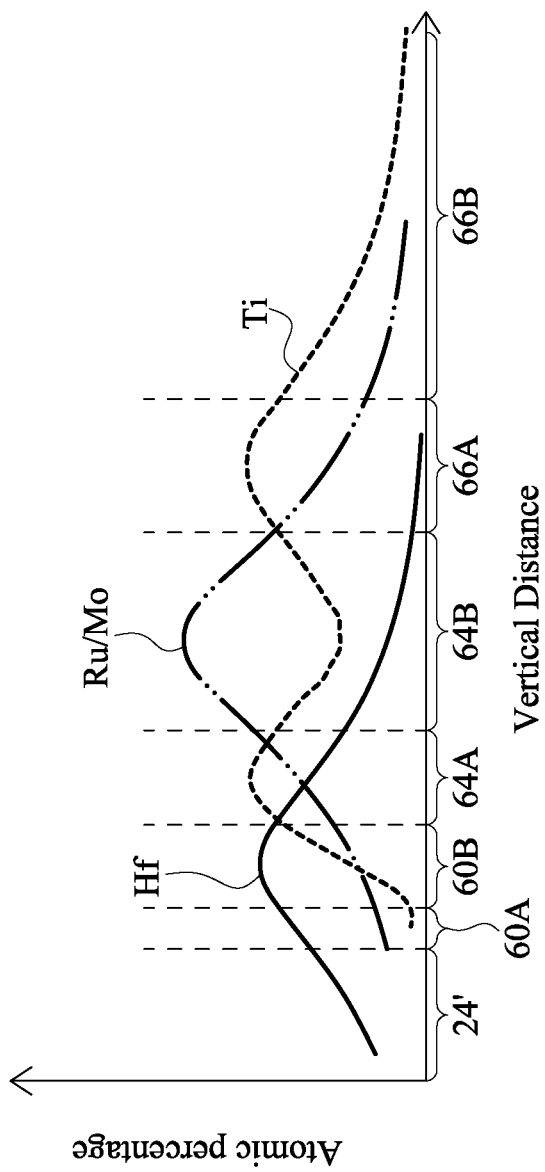

FIG. 22 schematically illustrates the Ru/Mo atomic percentage, titanium atomic percentage, and hafnium atomic percentage in gate stacks 70 (FIG. 19B) as functions of vertical distance in accordance with alternative embodiments. FIG. 21 corresponds to the embodiments in which work-function layer 64A is formed and comprising titanium. Accordingly, there may be peaks of titanium in both of work-function layer 64A and glue layer 66A.

The embodiments of the present disclosure have some advantageous features. By adopting Ru and/or Mo to form work-function layers, the process for forming n-type transistor and p-type transistor may share common processes, and hence the manufacturing cost is reduced. An additional work-function layer may also be formed along with the Ru/Mo work-function layer, and formed using selected materials, so that the threshold voltage may be further tuned. Accordingly, a plurality of transistors with different threshold voltages may be formed.

In accordance with some embodiments of the present disclosure, a method comprises forming a dummy gate stack over a semiconductor region; forming a source/drain region on a side of the dummy gate stack; removing the dummy gate stack to form a trench; forming a gate dielectric layer extending into the trench and on the semiconductor region; depositing a first work-function layer over the gate dielectric layer, wherein the first work-function layer comprises a metal selected from the group consisting of ruthenium, molybdenum, and combinations thereof; depositing a conductive filling layer over the first work-function layer; and performing a planarization process to remove excess portions of the conductive filling layer, the first work-function layer, and the gate dielectric layer to form a gate stack. In an embodiment, the forming the gate dielectric layer comprises depositing a high-k dielectric layer, and wherein the first work-function layer is in physical contact with the high-k dielectric layer. In an embodiment, the forming the gate dielectric layer comprises depositing a high-k dielectric layer, and wherein the method further comprises depositing a second work-function layer over and contacting the high-k dielectric layer, with the first work-function layer being deposited on the second work-function layer. In an embodiment, the gate stack is formed aside of the source/drain region, and wherein the second work-function layer is a p-type work-function layer, and wherein the source/drain region is of n-type.

In an embodiment, the depositing the second work-function layer comprises depositing a material selected from the group consisting of titanium nitride, tantalum nitride, and tungsten. In an embodiment, the gate stack is formed aside of the source/drain region, and wherein the second work-function layer is an n-type work-function layer, and wherein the source/drain region is of p-type. In an embodiment, the depositing the second work-function layer comprises depositing an aluminum-containing layer. In an embodiment, the metal in the first work-function layer comprises elemental metal atoms. In an embodiment, the depositing the first work-function layer comprises depositing a ruthenium layer. In an embodiment, the depositing the first work-function layer comprises depositing a molybdenum layer. In an embodiment, the depositing the conductive filling layer comprises depositing a titanium nitride layer, and the titanium nitride layer is in physical contact with the first work-function layer.

In accordance with some embodiments of the present disclosure, an integrated circuit structure comprises a semiconductor region; a source/drain region on a side of the semiconductor region; and a gate stack over the semiconductor region, the gate stack comprising a high-k gate dielectric layer; a first work-function layer on the high-k gate dielectric layer, wherein the first work-function layer comprises a metal selected from the group consisting of ruthenium, molybdenum, and combinations thereof; and a conductive filling layer on the first work-function layer.

In an embodiment, the metal in the first work-function layer comprises elemental metal atoms. In an embodiment, the first work-function layer comprises ruthenium. In an embodiment, the first work-function layer comprises molybdenum. In an embodiment, the integrated circuit structure further comprises a second work-function layer between the high-k gate dielectric layer and the first work-function layer, wherein the first work-function layer and the second work-function layer comprise different materials. In an embodiment, the second work-function layer is an p-type work-function layer comprising a material selected from the group consisting of titanium nitride, tantalum nitride, and tungsten, and the wherein the source/drain region is of n-type.

In accordance with some embodiments of the present disclosure, an integrated circuit structure comprises a first transistor comprising a first semiconductor region; a first gate spacer and a second gate spacer over the first semiconductor region; and a first gate stack over the first semiconductor region and between the first gate spacer and the second gate spacer, the first gate stack comprising a first high-k dielectric layer; a first work-function layer over and contacting the first high-k dielectric layer; a second work-function layer over and contacting the first work-function layer, wherein the second work-function layer comprises a metal selected from the group consisting of ruthenium, molybdenum, and combinations thereof; and a filling-metal region over and contacting the second work-function layer. In an embodiment, the integrated circuit structure further comprises a source/drain region on a side of the first gate stack, wherein the source/drain region is of n-type, and wherein the first work-function layer has a p-type work-function.

In an embodiment, the integrated circuit structure further comprises a second transistor, wherein the first transistor and the second transistor are of opposite conductivity types, and wherein the second transistor comprises a second semiconductor region; and a second gate stack over the second semiconductor region, the second gate stack comprising a second high-k dielectric layer; a third work-function layer over and contacting the second high-k dielectric layer, wherein the first work-function layer has an n-type work function, and the third work-function layer has a p-type work function; a fourth work-function layer over and contacting the third work-function layer, wherein the fourth work-function layer and the second work-function material are formed of same materials; and a second filling-metal region over and contacting the fourth work-function layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a dummy gate stack over a semiconductor region;
   forming a source/drain region on a side of the dummy gate stack, wherein the source/drain region is of n-type;
   removing the dummy gate stack to form a trench;
   forming a gate dielectric layer extending into the trench and on the semiconductor region;
   depositing a first work-function layer over the gate dielectric layer, wherein the first work-function layer comprises a metal selected from the group consisting of ruthenium, molybdenum;
   depositing a second work-function layer between the gate dielectric layer and the first work-function layer, wherein the second work-function layer is a p-type work-function layer;

depositing a conductive filling layer over the first work-function layer; and
performing a planarization process to remove excess portions of the conductive filling layer, the first work-function layer, and the gate dielectric layer to form a gate stack.

2. The method of claim 1, wherein the forming the gate dielectric layer comprises depositing a high-k dielectric layer.

3. The method of claim 2, wherein the second work-function layer is over and contacting the high-k dielectric layer.

4. The method of claim 1, wherein the depositing the second work-function layer comprises depositing a material selected from the group consisting of titanium nitride, tantalum nitride, and tungsten.

5. The method of claim 1, wherein the gate stack is formed aside of the source/drain region.

6. The method of claim 1, wherein the metal in the first work-function layer comprises elemental metal atoms.

7. The method of claim 1, wherein the depositing the first work-function layer comprises depositing a ruthenium layer.

8. The method of claim 7, wherein the ruthenium layer has a ruthenium atomic percentage greater than about 90 percent.

9. The method of claim 1, wherein the depositing the first work-function layer comprises depositing a molybdenum layer.

10. The method of claim 1, wherein the source/drain region and the gate stack are comprised in a gate-all-around transistor.

11. An integrated circuit structure comprising:
    a semiconductor region;
    a source/drain region on a side of the semiconductor region; and
    a gate stack over the semiconductor region, the gate stack comprising:
       a high-k gate dielectric layer;
       a first work-function layer over the high-k gate dielectric layer, wherein the first work-function layer comprises a metal selected from the group consisting of ruthenium, molybdenum, and combinations thereof, and wherein the first work-function layer has a mid-gap work function that is close to about 4.55 eV; and
       a conductive filling layer on the first work-function layer.

12. The integrated circuit structure of claim 11, wherein the metal in the first work-function layer comprises elemental metal atoms.

13. The integrated circuit structure of claim 11, wherein the first work-function layer comprises ruthenium.

14. The integrated circuit structure of claim 11, wherein the first work-function layer comprises molybdenum.

15. The integrated circuit structure of claim 11 further comprising a second work-function layer under the first work-function layer.

16. An integrated circuit structure comprising:
    a first transistor comprising:
       a first semiconductor region;
       a first gate spacer and a second gate spacer over the first semiconductor region; and
       a first gate stack over the first semiconductor region and between the first gate spacer and the second gate spacer, the first gate stack comprising:
          a first high-k dielectric layer;

US 12,696,513 B2

17 a first work-function layer over and contacting the first high-k dielectric layer;

a second work-function layer over and contacting the first work-function layer, wherein the second work-function layer comprises a metal selected from the group consisting of ruthenium, molybdenum, and combinations thereof;

a source/drain region on a side of the first gate stack, wherein the source/drain region and the first work-function layer have opposite conductivity types; and a filling-metal region over and contacting the second work-function layer.

17. The integrated circuit structure of claim 16 further comprising a second transistor, wherein the first transistor and the second transistor are of opposite conductivity types, and wherein the second transistor comprises:

a second semiconductor region; and a second gate stack over the second semiconductor region, the second gate stack comprising:

a second high-k dielectric layer;

18 a third work-function layer over and contacting the second high-k dielectric layer, wherein the first work-function layer has an n-type work function, and the third work-function layer has a p-type work function;

a fourth work-function layer over and contacting the third work-function layer, wherein the fourth work-function layer and the second work-function layer are formed of same materials; and a second filling-metal region over and contacting the fourth work-function layer.

18. The integrated circuit structure of claim 16, wherein the source/drain region is of n-type, and the first work-function layer has a p-type work-function.

19. The integrated circuit structure of claim 16, wherein the metal in the second work-function layer has an atomic percentage greater than about 90 percent.

20. The integrated circuit structure of claim 16, wherein the first transistor comprises a gate-all-around transistor.

* * * * *